(12) United States Patent
Katsumata et al.

(10) Patent No.: US 7,539,056 B2
(45) Date of Patent: May 26, 2009

(54) NONVOLATILE SEMICONDUCTOR MEMORY

(75) Inventors: Ryota Katsumata, Yokohama (JP); Masaru Kito, Yokohama (JP); Hideaki Aochi, Kawasaki (JP); Hiroyasu Tanaka, Tokyo (JP); Masaru Kidoh, Kawasaki (JP); Mitsuru Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 118 days.

(21) Appl. No.: 11/896,261

(22) Filed: Aug. 30, 2007

(65) Prior Publication Data
US 2008/0186771 A1 Aug. 7, 2008

(30) Foreign Application Priority Data
Feb. 1, 2007 (JP) ............................. 2007-023509

(51) Int. Cl.
*G11C 16/04* (2006.01)
(52) U.S. Cl. ........................... 365/185.18; 365/185.27; 365/185.28
(58) Field of Classification Search ............ 365/185.17, 365/185.11, 185.18, 185.27, 185.28, 185.14
See application file for complete search history.

(56) References Cited

U.S. PATENT DOCUMENTS

| | | | |
|---|---|---|---|
| 5,308,778 A | 5/1994 | Fitch et al. | |
| 5,612,563 A | 3/1997 | Fitch et al. | |
| 5,740,107 A * | 4/1998 | Lee | ........................ 365/185.11 |
| 6,285,587 B1 * | 9/2001 | Kwon | .................... 365/185.11 |
| 6,727,544 B2 | 4/2004 | Endoh et al. | |
| 6,870,215 B2 | 3/2005 | Endoh et al. | |
| 7,177,196 B2 * | 2/2007 | Takeuchi et al. | ........ 365/185.22 |

FOREIGN PATENT DOCUMENTS

JP 2002-299478 10/2002

* cited by examiner

*Primary Examiner*—Son Dinh
*Assistant Examiner*—Hien N Nguyen
(74) *Attorney, Agent, or Firm*—Finnegan, Henderson, Farabow, Garrett & Dunner, L.L.P.

(57) ABSTRACT

In a NAND type flash memory, control electrodes of first select transistors in a plurality memory cell units extending along a data line is integrated to constitute a first select signal line while control electrodes of second select transistor are integrated to constitute a second select signal line. The second select signal line is displaced from the first select signal line by a half pitch.

20 Claims, 27 Drawing Sheets

2

NONVOLATILE SEMICONDUCTOR MEMORY

CROSS REFERENCE TO THE RELATED APPLICATION

This application is based upon and claims the benefit of priority from prior Japanese Patent Application No. 2007-023509 filed on Feb. 1, 2007, the entire contents of which are incorporated herein by reference.

BACKGROUND OF THE INVENTION

1. Field of the Invention

This invention relates to a nonvolatile semiconductor memory, and more particularly to a nonvolatile semiconductor memory in which data lines are electrically connected via select transistors to one end of a memory string where a plurality of memory cells are electrically connected in series.

2. Description of the Related Art

Nonvolatile semiconductor memories or NAND type flash memories are under development, since they can electrically erase data and have a large memory capacity. The NAND type flash memory includes a memory cell array in which memory cell units are regularly arranged. Source lines and data lines are connected to opposite ends of the memory cell units.

Each memory cell unit includes a memory string to which a plurality of memory cells are electrically connected; a source selecting transistor electrically connected to one end of the memory string; and a drain selecting transistor electrically connected to the other end of the memory string. A source line is connected to a source region of the source selecting transistor. For instance, a common signal line is connected to a gate electrode. The data lines are connected to a drain region of the drain selecting transistor, and a drain selecting line (drain selecting gate line) is connected to the gate electrode. Each memory cell connected to the memory string is constituted by a transistor having a charge accumulating region. Word lines are connected to the gate electrode of the foregoing transistor. Charges serving as data are accumulated in the charge accumulating region.

In the nonvolatile semiconductor memory, the word lines extend across the memory cells, are regularly spaced similarly to the memory cells, and are connected to opposite ends of the memory string. The data lines extend along the word lines, and are regularly spaced similarly to the memory cell units. The source selecting signal lines are adjacent to and extend along the word lines. The drain selecting signal lines are adjacent to and extend along the word lines. The source selecting signal lines and the drain selecting signal lines are present on a conductive layer of the word lines, and are made of a gate material same as that of the word lines. Specifically, a gate material which can withstand a high temperature in a manufacturing process is used.

Japanese Patent Laid-Open Publication No. 2002-299478 describes one example of such NAND type flash memories.

The following problems are conceivable in the foregoing NAND type flash memories. As NAND type flash memories are being modified to have a large memory capacity, memory cells have to be downsized. The more extensively memory cells are shrunk, the smaller a line-and-space size. This leads to a reduced wiring width of the drain selecting signal lines. Therefore, the drain selecting signal lines tend to have large resistances, which inevitably reduces data reading speeds.

Further, as the memory cells are downsized, a width of the memory cell units and a space between the memory cell units tend to be reduced. This would lead to a reduced wiring width of the data lines. Therefore, the data lines tend to have a large resistance, and the data reading speed will be slowed down.

BRIEF SUMMARY OF THE INVENTION

According to one aspect of the present invention, there is provided a nonvolatile semiconductor memory including a data line; a first memory cell unit including not only a first memory string in which a plurality of memory cells with charge accumulating regions are electrically connected in series but also first and second select transistors connected to the data line from one end of the first memory string; a second memory cell unit including not only a second memory string structured similarly to the first memory string but also third and fourth select transistors connected to the data line from one end of the second memory string, the second memory cell unit being adjacent to the first memory cell unit; a third memory cell unit including not only a third memory string structured similarly to the first memory string but also fifth and sixth select transistors connected to the data line from one end of the third memory string, the third memory cell unit being adjacent to the second memory cell unit; a first select signal line electrically connected to a control electrode of the first select transistor of the first memory cell unit and to a control electrode of the third select transistor of the second memory cell unit; and a second select signal line electrically connected to a control electrode of the fourth select transistor of the second memory cell unit and to a control electrode of the sixth select transistor of the third memory cell unit.

According to another aspect of the present invention, there is provided a nonvolatile semiconductor memory including a first memory cell unit including a first memory string to which a plurality of memory cells having charge accumulating regions and placed on a surface of a substrate are electrically connected in series; a first enhancement type select transistor electrically connected in series to one end of the first memory string; and a second depression type select transistor electrically connected in series to the first select transistor; a second memory cell unit including a second memory string structured similarly to the first memory string; a third depression type select transistor electrically connected in series to one end of the second memory string; a fourth enhancement type select transistor electrically connected in series to the third select transistor, the second memory cell unit being adjacent to the first memory cell unit; a first select signal line connected to the first and third select transistors; a second select signal line connected to the second and fourth select transistors; and a data line extending across the first and second memory cell units, and electrically connected to the second select transistor of the first memory cell unit and the fourth select transistor of the second memory cell unit.

BRIEF DESCRIPTION OF THE DRAWINGS

Like or corresponding parts are denoted by like or corresponding reference numerals.

DETAILED DESCRIPTION OF THE INVENTION

Figure 1:
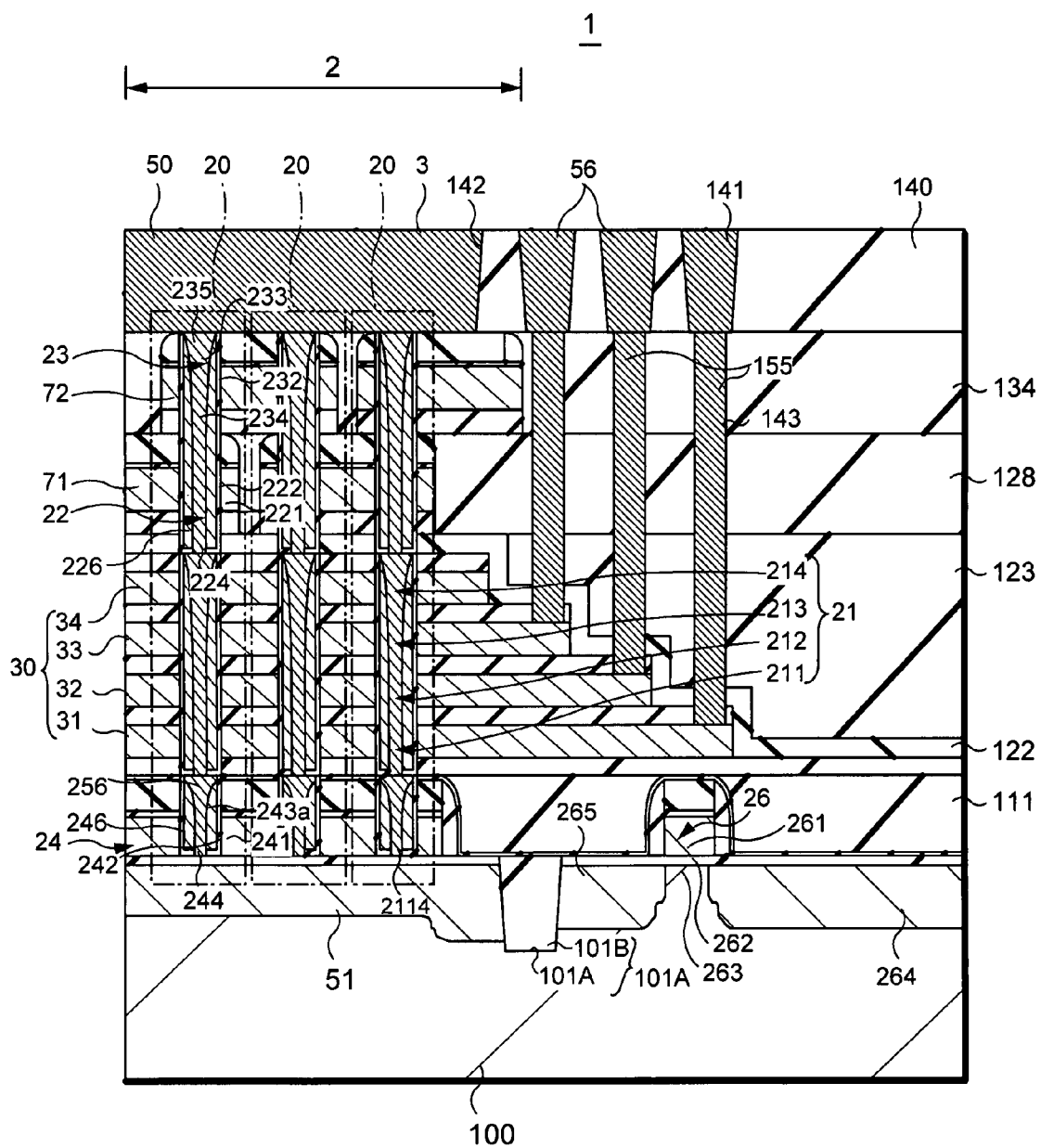
FIG. 1 is a detailed cross section of an essential part of a nonvolatile semiconductor memory according to a first embodiment of the invention.
Figure 2:
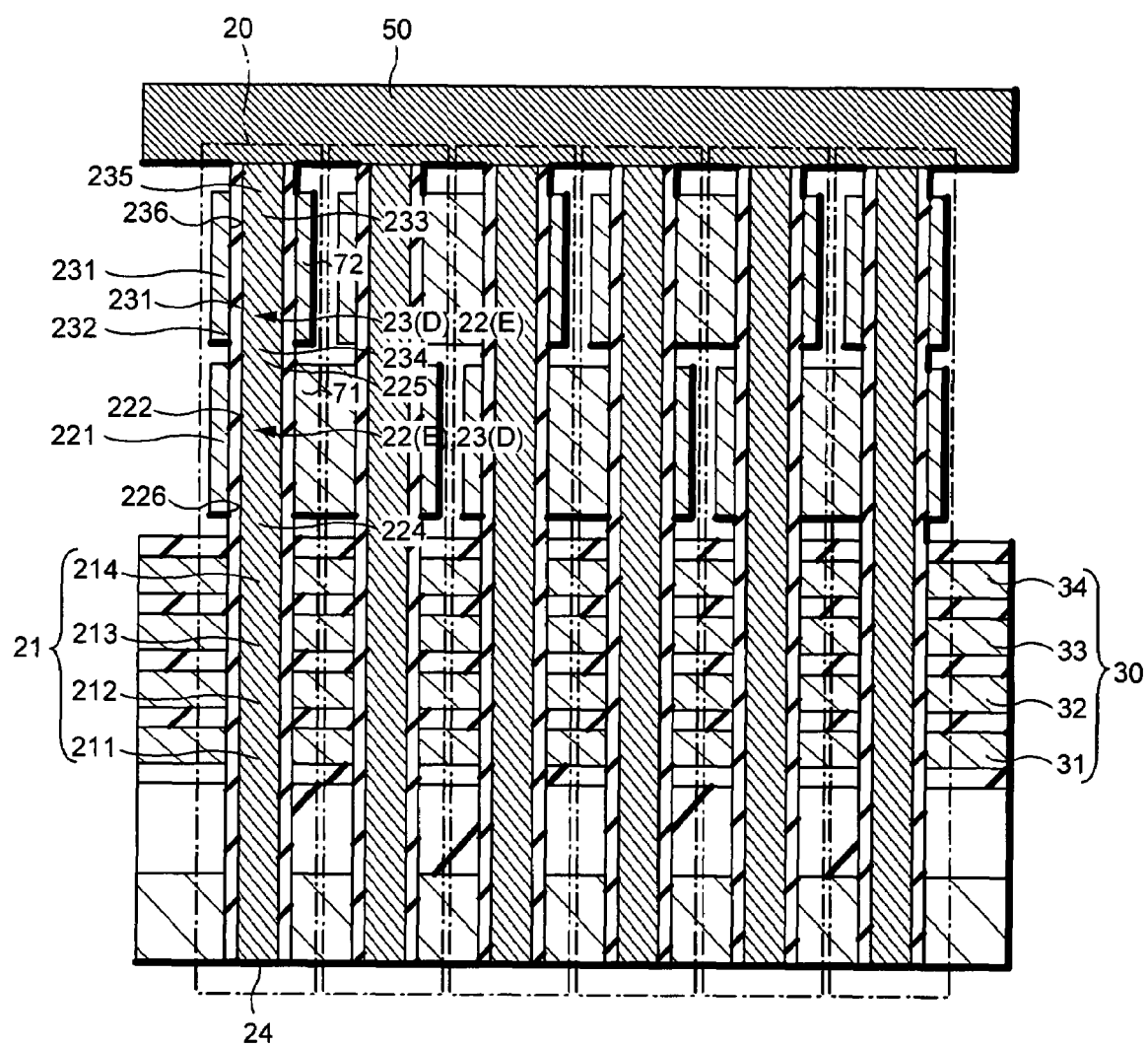
FIG. 2 is a schematic cross section of the essential part of the nonvolatile semiconductor memory (taken along line F2-F2 in FIG. 4)
Figure 3:
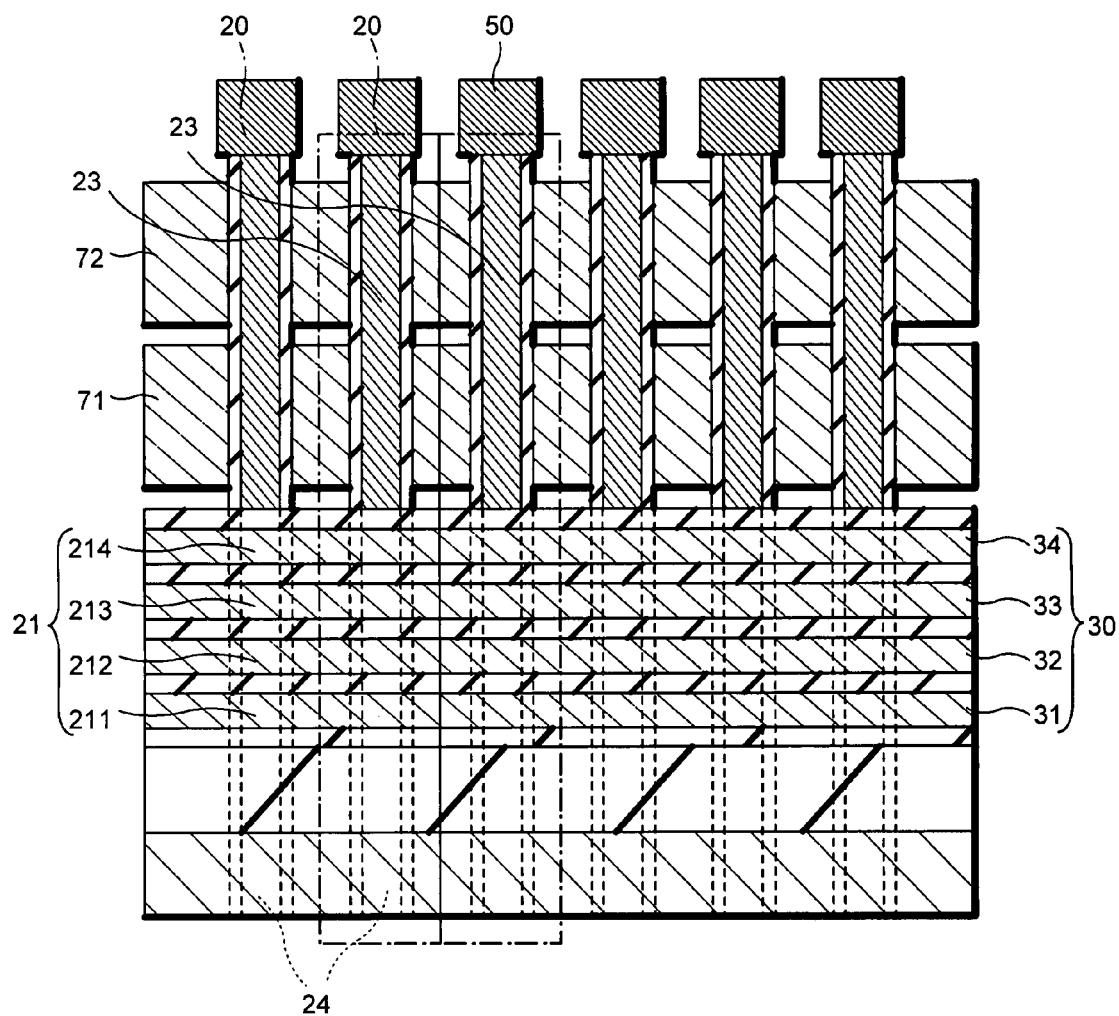
FIG. 3 is a schematic cross section of the essential part of the nonvolatile semiconductor memory (taken along line F3-F3 in FIG. 4)
Figure 4:
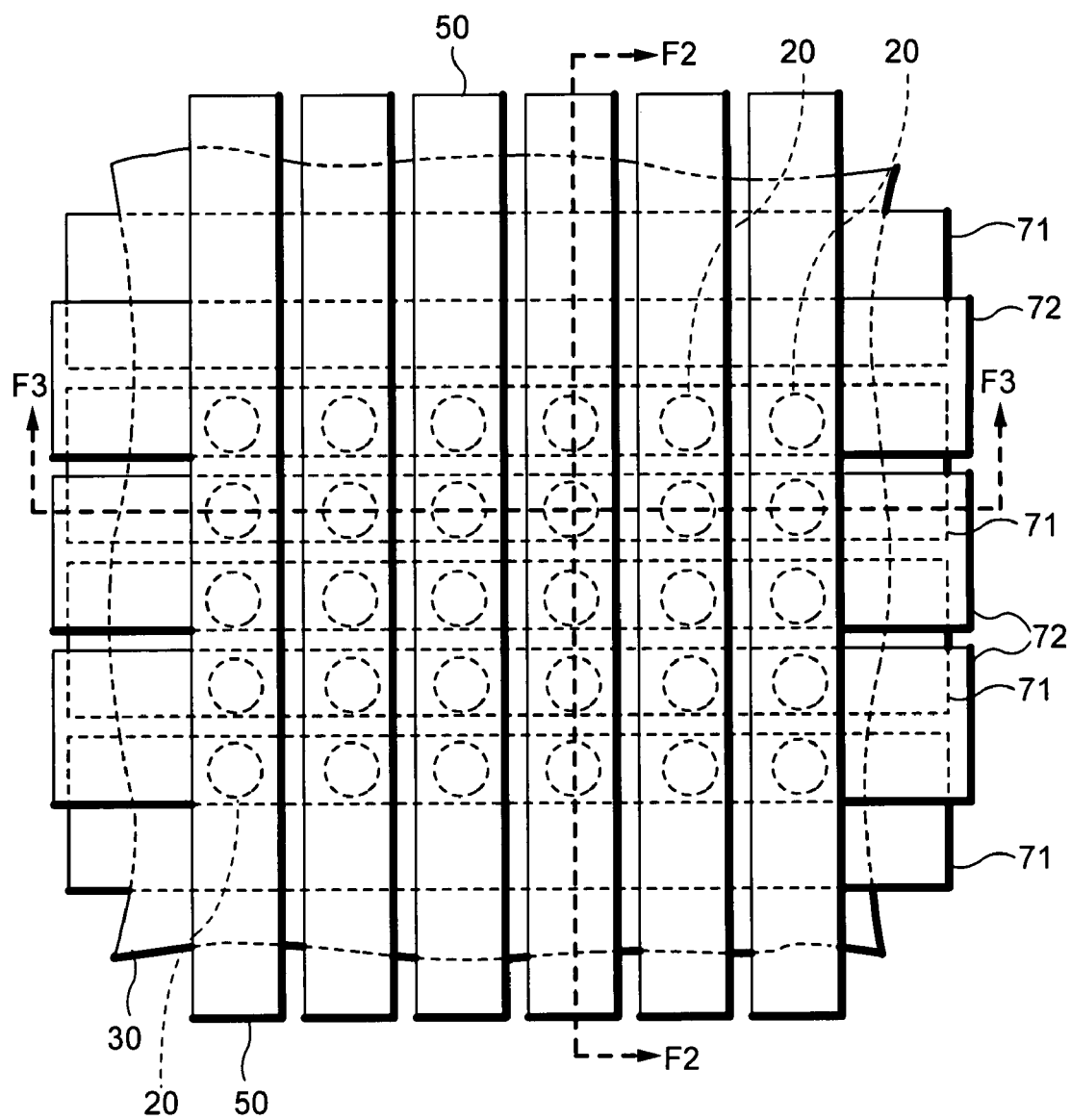
FIG. 4 is a schematic top plan view of the essential part of the nonvolatile semiconductor memory of FIG. 1.

Embodiments of the present invention will be described below with reference to the accompanying drawing. In the following description, the same reference numerals denote constituent elements having the same function and arrangement, and a repetitive description thereof will be made only when necessary.

First Embodiment

It is assumed in a first embodiment that the invention is applied to a select transistor and a signal select line in a NAND type flash memory 1.

[Overall System Configuration of NAND Type Flash Memory]

Figure 6:
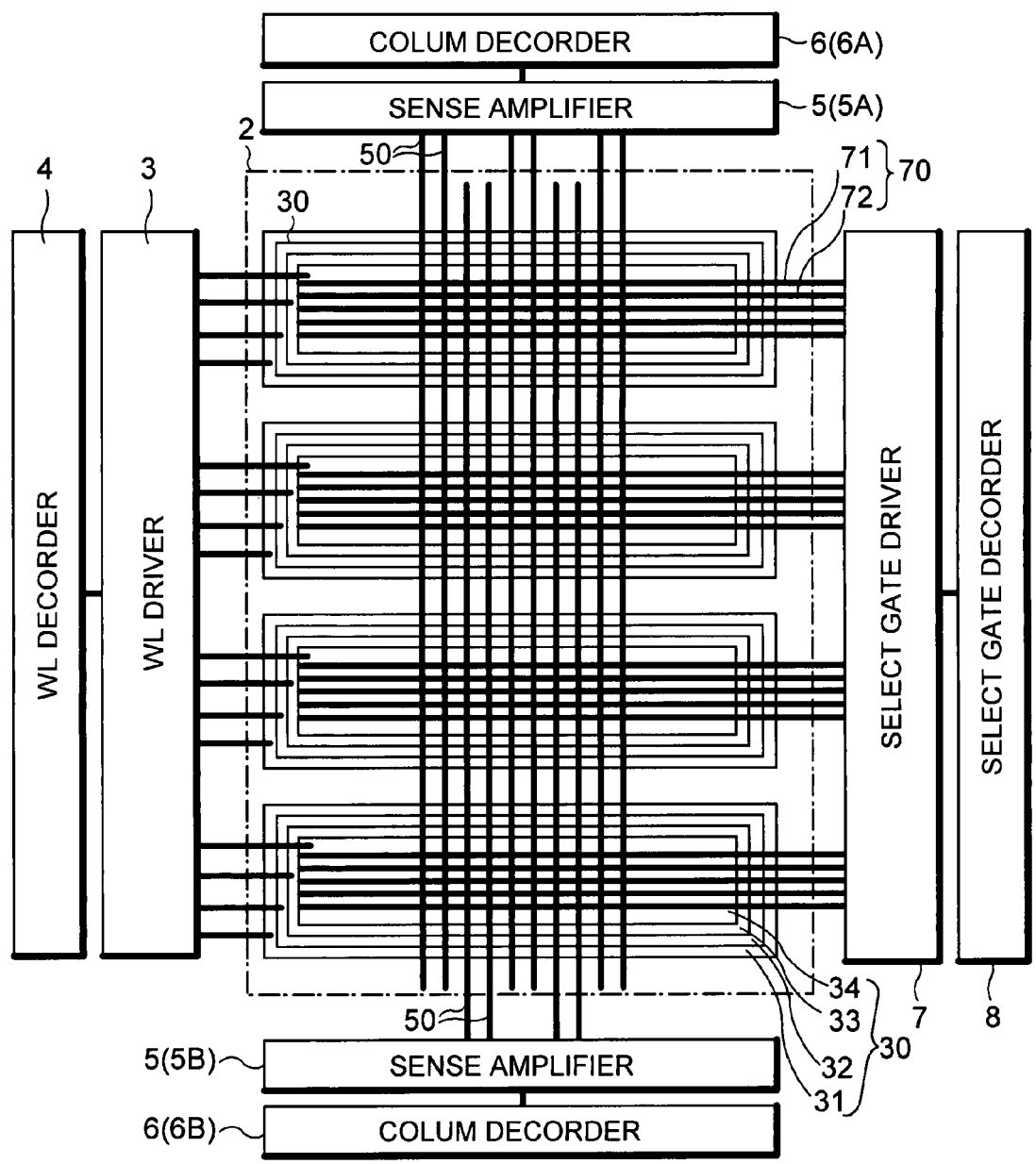
FIG. 6 shows an overall system configuration of the nonvolatile semiconductor memory.

Referring to FIG. 6, the NAND type flash memory 1 includes a memory cell array 2, a select gate driver 7, a select gate decoder 8, a word line driver 3, a word line decoder 4, sense amplifiers 5, and a column decoder 6.

The select gate driver 7 and the select gate decoder 8 are placed at a right side (first side) of the memory cell array 2. In the memory cell array 2, the select gate driver 7 extends from side to side, and activates (selects or non-selects) signal select lines 70 which are lengthways arranged at regular intervals. The select gate decoder 8 controls operations of the select gate driver 7.

The word line driver 3 and the word line decoder 4 are placed at a left side (second side) opposite to the right side of the memory cell array 2. The word line driver 3 activates (selects or non-selects) word lines 30. The word line decoder 4 controls operations of the word line driver 3.

The sense amplifier 5 (constituted by sense amplifier units 5A and 5B) and column decoder 6 (constituted by column decoder units 6A and 6B) are at upper and lower sides (third and fourth sides) of the memory cell array 2. Specifically, the sense amplifier unit 5A and the column decoder unit 6A are at the upper side while the sense amplifier unit 5B and the column decoder unit 6B at the lower side. The sense amplifier units 5A and 5B are connected to data lines 50, read data from the memory cells via the data line 50, and amplify the read data. The column decoder 6 controls the operation of the sense amplifier 5.

[Circuit Configuration of Memory Cell Unit of NAND Type Flash Memory]

The memory cell array 2 includes memory cell units 20 (e.g., 20(1), 20(2) and so on) arranged in the shape of a matrix. Each memory cell unit 20 is constituted by a memory string 21 electrically connecting a plurality of memory cells 211, 212, 213 and 214 in series; a select transistor 24; a first (third or fourth) select transistor 22; and a second (fourth or sixth) select transistor 23. The select transistor 24 is electrically connected in series to a source of the memory cell 211 at one end of the memory string 21. The select transistor 22 is electrically connected in series to a drain of the memory cell 214 at the other end of the memory string 21. The select transistor 23 is electrically connected in series to a drain of the first select transistor 22.

Each of the memory cells 211 to 214 connected to the memory string 21 has the same structure, and is constituted by a transistor having a charge accumulating region, i.e., specifically an n-channel conductive insulated gate field effect transistor (IGFET). The drain of the memory cell 211 is electrically connected to a source of the memory cell 212. A drain of the memory cell 212 is electrically connected to a source of the memory cell 213. A drain of the memory cell 213 is electrically connected to a source of the memory cell 214. A control electrode (gate electrode) of the memory cell 211 is electrically connected to a word line 31. A control electrode of the memory cell 212 is electrically connected to a word line 32. A control electrode of the memory cell 213 is electrically connected to a word line 33. A control electrode of the memory cell 214 is electrically connected to a word line 34. In the first embodiment, the four memory cells 211 to 214 are electrically connected in series by the memory string 21. Alternatively, any number of memory cells such as eight, sixteen memory cells may be connected in order to accomplish a byte organization. A device structure of the memory cells 211 to 214 will be detailed later.

The select transistor 24 has its drain electrically connected to the source of the memory cell 211 and its source electrically connected to a source line 51. The select transistor 24 is an n-channel conductive IGFET. The source and drain of the first select transistor 22 are electrically connected to the drain of the memory cell 214 and the source of the second select transistor 23, respectively, as described above. The drain of the first select transistor 22 is electrically connected to the data line 50. The first and second select transistors 22 and 23 are n-channel conductive IGFETs, and have enhanced threshold voltages.

For instance, the memory cell units 20(2), 20(3) and 20 (4) are electrically connected in parallel to one data line 50, and extend along the data line 50. The control electrode (gate electrode) of the first select transistor 22 of the memory cell unit 20(2) is electrically connected to the control electrode of the first (third) select transistor 22 of the memory cell unit 20(3) adjacent to and downstream of the memory cell unit 20(2). These control electrodes are electrically connected to a first select signal line 71. The control electrode of the second (fourth) select transistor 23 of the memory cell unit 20(3) is electrically connected to the control electrode of the second (sixth) select transistor 22 of the memory cell unit 20(4) adjacent to and downstream of the memory cell unit 20(3). The second-mentioned control electrodes are electrically connected to a second select signal line 72. The memory cell units 20(2) and 20(4) are positioned at the opposite sides of the memory cell unit 20(4). In other words, when observing the three adjacent memory cell units 20(2), 20(3) and 20(4), with the center memory cell unit 20(3) at the center, the control electrode of the first select transistor 22 is connected to the first select signal line 71 together with the control electrode of the first select transistor 22 of the memory cell unit 20(2). The control electrode of the second select transistor 23 is connected to the second signal select line 72 together with the control electrode of the second select transistor of the memory cell unit 20(4).

Still in other words, the control electrodes of the first select transistors 22 of the adjacent memory cell units 20(2) and 20(3), which are connected to one data line 50, are connected to one first select signal line 71. Further, the control electrodes of the second select transistors 23 of the adjacent memory cell units 20(3) and 20(4), which are connected to the data line 50, are connected to one second select signal line 72. The first and second select signal lines 71 and 72 are out of alignment with a pitch of the memory cell units 20, and overlap with each other.

In the first embodiment, the data line 50, the three memory cell units 20(2), 20(3) and 20(4) connected to the data line 50, and the first and second select signal lines 71 and 72 connected to the first and second select transistors 22 and 23 function as a basic circuit element. A plurality of basic circuit elements are duplicated in the memory cell units 20, and are connected as described above. The first and second select transistors 22 and 23 are electrically connected in series between the memory string 21 and the data line 50 of the memory cell unit 20. Alternatively, three or more select transistors may be connected in series. In such a case, a third select signal line will be necessary in addition to the first and second select signal lines 71 and 72.

[Circuit Configuration of Select Gate Driver and Select Gate Decoder]

Figure 5:
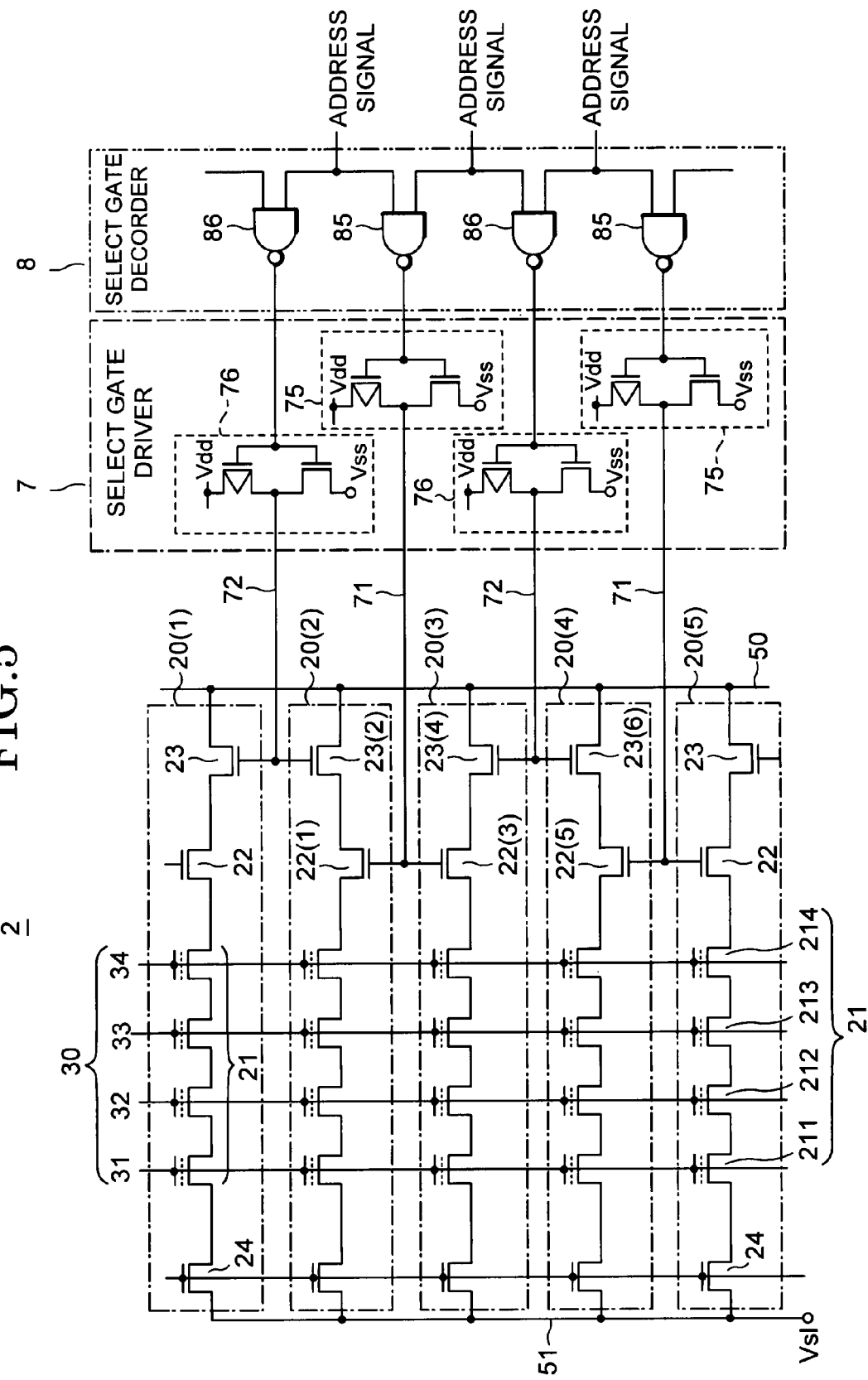
FIG. 5 is a circuit diagram of the essential part of the nonvolatile semiconductor memory according to the first embodiment of the invention.

Referring to FIG. 5, the select gate driver 7 is constituted by a first driver unit 75 connected to the first select signal line 71, and a second driver unit 76 connected to the second select signal line 72. The first and second driver units 75 and 76 are complementary IGFETs including p- and n-channel conductive IGFETs. Drains of the p-channel and n-channel conductive IGFETs are connected to the first or second select signal line 71 or 72. A source of the p-channel conductive IGFET is connected to a power source terminal Vdd while a source of the n-channel conductive IGFET is connected to a reference power source terminal Vss. A control electrode (gate electrode) of the p-channel conductive IGFET and a control electrode of the n-channel conductive IGFET are connected to the select gate decoder 8.

The select gate decoder 8 includes a first decoder unit 85 connected to the first driver unit 75 of the select gate driver 7, and a second decoder unit 86 connected to the second driver unit 76 as shown in FIG. 5. The first and second decoder units 85 and 86 are constituted by 2-input NAND gate circuits. Input terminals of adjacent first and second decoder units 85 and 86 are similarly wired so as to receive the same address signal is input.

[General Structure of Memory Cell Units, Memory Cells and Select Transistors]

Figure 18:
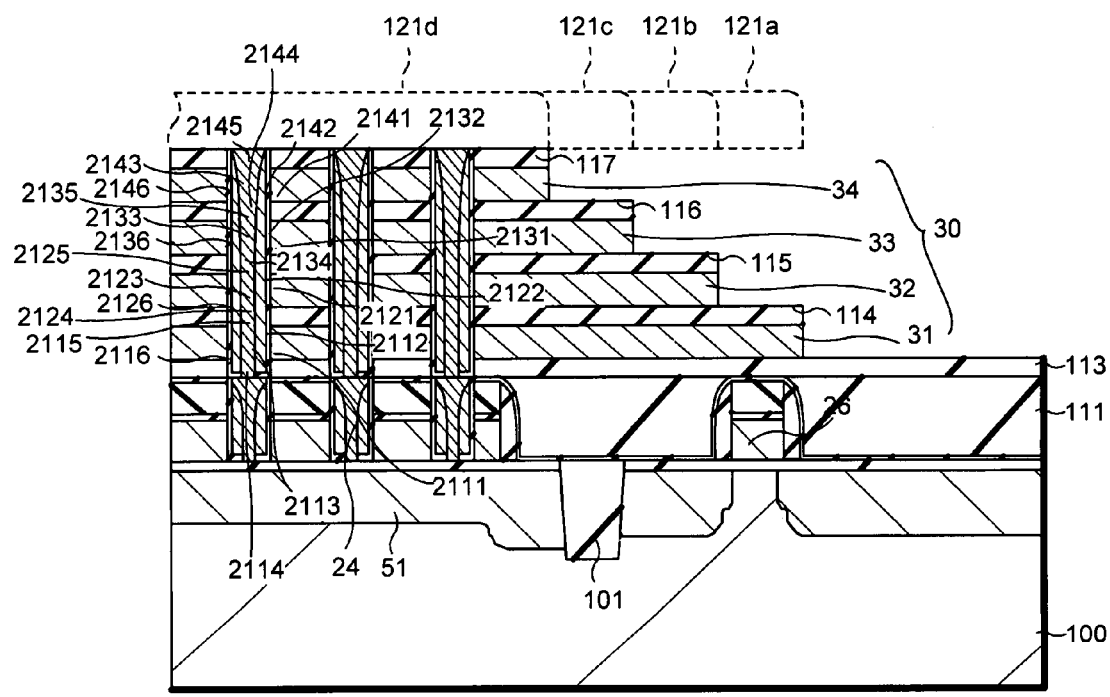
FIG. 18 is a cross section showing how the nonvolatile semiconductor memory is fabricated in a twelfth fabricating process.

A detailed structure of the NAND type flash memory 1 will be described with reference to FIG. 1 to FIG. 4 and FIG. 18 as well as FIG. 5. In FIG. 1, inter-layer dielectrics are shown as well as the essential part of the NAND type flash memory 1. FIG. 18 specifically shows the structure of the memory string 21.

The NAND type flash memory 1 is mainly constituted by a substrate 100, which is preferably a p-type silicon single crystal substrate, or a p-type or n-type silicon single crystal substrate having a p-type well region on a surface (not shown). An element isolation area 101 is placed between the memory cell array 2 and a peripheral circuit, and between semiconductor elements constituting the peripheral circuit. Specifically, the peripheral circuit is constituted at least by the word line driver 3, word line decoder 4, sense amplifier 5, column decoder 6, select gate driver 7 and select gate decoder 8. The element isolation area 101 has the shallow trench isolation (STI) structure, and includes a trench 101A, and an insulator 101B filled in the trench 101A. The element isolation area 101 extends deep into the substrate 100, and decreases its area on the substrate 100.

The source line 51 is placed on a main surface of the substrate 100 of the memory cell array 2, and is constituted by an n-type semiconductor region (n-type diffusion region) which has a low resistance and a high impurity concentration.

The select transistor 24 of the memory cell units 20 is constituted by n-channel conductive IGFETs. Specifically, the select transistor 24 includes a control electrode (gate electrode) 241 placed on the source line 51 on the substrate 100; a gate insulator film 242 placed on an inner surface of a through-hole (memory hole) 246 longitudinally extending through the control electrode 241; a channel forming region 243 placed on the inner surface of the through-hole 246 via the gate insulator film 242; a main electrode region (e.g. a source region) 244 electrically connected between one end of the channel forming region 243 and the source line 51; and another main electrode region (e.g. a drain region) 245 electrically connected between the other end of the channel forming region 243 and the memory string 21. The channel forming region 243 is cylindrical (triangular or polygonal), stands erect on the substrate 100, and has its outer surface entirely surrounded by the control electrode 241. In other words, the channel of the select transistor 24 longitudinally extends on the substrate 100. The main electrode regions 244 and 245 are made of the material (i.e. Si as the gate electrode material) same as that of the channel forming region 243, and are integrated.

The memory cell 211 is placed on the select transistor 24, and is constituted by a control electrode (control gate electrode) 2111; a charge accumulating region 2112 placed on an inner wall of a through-hole (memory hole) 2116 longitudinally extending through the control electrode 2111; a channel forming region 2113 embedded in an inner wall (an outer wall of the control electrode 2111) via the charge accumulating region 2112; a source 2114; and a drain 2115. The channel forming region 2113 is cylindrical (or polygonal), stands on the substrate 100, and has its outer surface entirely surrounded by the control electrode 2111. In other words, the channel of the memory cell 211 longitudinally extends on the substrate 100. The control gate electrode 2111 is made of the conductive material same as that of the word line 31 at the bottom of the memory cell array 2, and is integral with the word line 31. Further, the charge accumulating region 2112 of the memory cell 211 has the SANOS structure, in which the control electrode 2111 and the channel forming region 2113 are made of Si films, and an $Al_2O_3$ film, an $Si_3N_4$ film and an $SiO_2$ film are stacked between the control electrode 2111 and the channel forming region 2113. In the charge accumulating region 2112, the $SiO_2$ film in contact with the channel forming region 2113 functions as a tunnel insulator and a gate insulator film, and accumulates charges as data at an interface between the $SiO_2$ film and the $Si_3N_4$ film. The source 2114 supplies a read-out current flowing between the data line 50 and the source line 51 while the drain 2115 discharges the data. The source 2114 is electrically connected to a main electrode region 245 of the select transistor 24. In the source 2114 and the drain 2115, there is no region.

The memory cell 212 is present on the memory cell 211, and is structured similarly to the memory cell 211. The memory cell 212 is constituted by a control electrode 2121; a charge accumulating region 2122 placed on an inner surface of a through-hole (memory hole) 2126 longitudinally extending through the control electrode 2121; a channel forming region 2123 embedded in an inner wall (an outer wall of the control electrode 2121) via the charge accumulating region 2122; a source 2124; and a drain 2125. The channel forming region 2123 is cylindrical (or polygonal), stands on the substrate 100, and has its outer surface entirely surrounded by the control electrode 2121. In other words, the channel of the memory cell 212 stands on the substrate 100. The control electrode 2121 is made of the conductive material same as that of the word line 32 which is second from the bottom of the memory cell array 2, and is integral with the word line 32. The SANOS structure is adopted for the charge forming region 2122 of the memory cell 212. The source 2124 is electrically connected to the main electrode region 2115 of the memory cell 211.

The memory cell 213 is placed on the memory cell 212, and is structured similarly to the memory cell 211. The memory cell 213 is constituted by a control electrode 2131; a charge accumulating region 2132 placed on an inner surface of a through-hole 2136 extending longitudinally through the control electrode 2131; a channel forming region 2133 embedded in an inner wall (an outer wall of the control electrode 2131) of the through-hole 2136 via the charge accumulating region 2132; a source 2134; and a drain 2135. The outer wall of the channel forming region 2133 is cylindrical (or polygonal), is completely surrounded by the control electrode 2131, and stands on the substrate 100. In other words, the channel of the memory cell 213 longitudinally extends on the electrode 100. The control electrode 2131 is made of a conductive material same as that of the word line 33 which is on the third layer from the bottom of the memory cell array 2. In short, the control electrode 2131 is integral with the word line 33. The charge accumulating region 2132 of the memory cell 213 has the SANOS structure. The source 2134 is electrically connected to the main electrode region 2135.

The memory cell 214 is placed on the memory cell 213, and is similarly structured to the memory cell 211. The memory cell 214 is constituted by a control electrode 2141; a charge accumulating region 2142 placed on an inner surface of a through-hole 2146 longitudinally extending through the control electrode 2141; a channel forming region 2143 embedded in an inner wall (an outer wall of the control electrode 2141) of the through-hole 2146 via the charge accumulating region 2142; a source 2144; and a drain 2145. The channel forming region 2143 is cylindrical (or polygonal), is totally surrounded by the control electrode 2141, and stands on the substrate 100. In other words, the channel of the memory cell 214 longitudinally extends on the electrode 100. The control electrode 2141 is made of a conductive material same as that of the word line 33 which is on the third layer from the bottom of the memory cell array 2. In short, the control electrode 2141 is integral with the word line 34. The charge accumulating region 2142 of the memory cell 214 has the SANOS structure. The source 2144 is electrically connected to the main electrode region 2145.

The first select transistors 22 of the memory cell units 20 are n-channel conductive IGFETs. Specifically, each select transistor 22 includes a control electrode (gate electrode) 221 placed on the memory cell 214; a gate insulator film 222 placed on an inner surface of a through-hole (memory hole) 226 longitudinally extending through the control electrode 221; a channel forming region 223 placed on the inner wall of the through-hole 226 via the gate insulator film 222; a main electrode region (e.g. a source region) 224 electrically connected to one end of the channel forming region 223 and a drain 2145 of the memory cell 214; and another main electrode region (e.g. a drain region) 225 electrically connected to the other end of the channel forming region 223. The channel forming region 223 is cylindrical (triangular or polygonal), stands on the substrate 100, and has its outer wall entirely surrounded by the control electrode 221. In other words, the channel of the select transistor 24 longitudinally extends on the substrate 100. The control electrodes 221 of the two adjacent first select transistors 22 of the two memory cell units 20, which are adjacent along the data line 50, are integral without any space. The control electrodes 221 are made of the material same as that of the first signal select lines 71, and are integral with the first signal select lines 71. In short, the two first signal lines 71 which are adjacent with each other along the data lines 50 are joined without any space, and are widened. For instance, if the line size and the space size are equal, one select signal line 71 has a width which is equal to sizes of two lines and a size of one space. Therefore, a resistance value of each first select signal line 71 can be made a half or one third. The main electrode regions 224 and 225 are made of the material same as that of the channel forming region 223 (e.g., Si as the gate electrode material), and are integral with each other.

The second transistors 23 are n-channel conductive IGFETs. Specifically, each select transistor 23 includes a control electrode (gate electrode) 231 placed on the first select transistor 22; a gate insulator film 232 placed on an inner surface of a through-hole (memory hole) 236 longitudinally extending through the control electrode 231; a channel forming region 233 placed on the inner surface of the through-hole 236 via the gate insulator film 232; a main electrode region (e.g. a source region) 234 electrically connected to one end of the channel forming region 233; and another main electrode region (e.g. a drain region) 235 electrically connected to the other end of the channel forming region 233. The channel forming region 233 is cylindrical (triangular or polygonal), stands on the substrate 100, and has its outer surface entirely surrounded by the control electrode 231. In other words, the channel of the second select transistor 23 longitudinally extends on the surface of the substrate 100. The control electrodes 231 of the two adjacent first select transistors 23 are adjacent along the data line 50, and are integral without any space. The control electrodes 231 are made of the material same as that of the second signal select lines 72, and are integral. In short, the two first signal lines 71 which are adjacent with each other along the data lines 50 are joined without any space, and are widened. Therefore, the second select signal lines 72 are arranged with a wiring pitch which deviates by ½ from a wiring pitch of the first select signal lines 71. The second select signal lines 72 have a resistance value which is half of the resistance of the first signal lines 71.

The data line 50 is placed on the second select transistor 23, and is electrically connected to the main electrode range 225 of the second select transistor 23. The data line 50 is constituted by a low resistance wiring material which is prepared by the damascene process and is placed on a barrier metal film such as a laminated Cu film or a laminated Cu alloy film.

As shown at the right side of FIG. 1, an n-channel conductive IGFET 26 constituting a peripheral circuit is positioned on the main surface of the substrate 100. The n-channel conductive IGFET 26 includes a channel forming region 263 on the substrate 100, a gate insulator film 262 on the channel forming region 263, a control electrode (gate electrode) 261 on the gate insulator film 262, a main electrode region (e.g. source region) 264 placed at opposite sides of the control electrode 261 on the main surface of the substrate 100, and a main electrode region (e.g. drain region) 265 placed on the substrate 100. Although not shown in FIG. 1, the peripheral circuit of the NAND flash memory 1 is a complementary IGFET constituted by the n-channel conductive IGFET 26 and a p-channel conductive IGFET.

Referring to FIG. 6, each word line 30 in the shape of a flat film of the memory cell array 2 is provided for every memory block in which a predetermined number of memory cell units 20 is regularly arranged. Each memory block is totally covered by each flat word line 30. The word line 30 includes word lines 31 to 34. The word line 31 is largest while the word line 34 is smallest, e.g. the word lines 31 to 34 are in the shape of a step or a trapezoid. Connecting areas of the word lines 31 to 34 extend over the periphery of the memory cell array 2 or the peripheral circuit. The word lines 31 to 34 are electrically connected to wirings 155 and 56 via the connecting areas. The wirings 155 and 56 are made of a material same as that of the data line 50, and are flush with each other. The wiring 56 is electrically connected to the word line driver 3 shown in FIG. 6.

[Method of Fabricating NAND Type Flash Memory]

The NAND type flash memory 1 will be fabricated as shown in FIG. 7 to FIG. 28.

Figure 7:
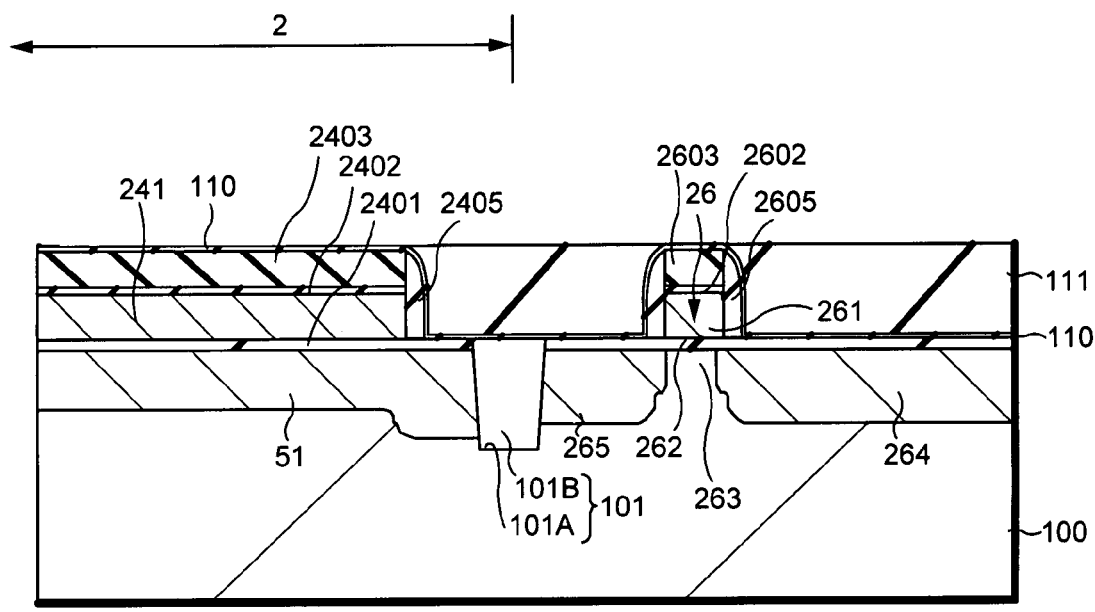
FIG. 7 is a cross section showing how the nonvolatile semiconductor memory is fabricated in a first fabricating process.

First of all, the substrate 100 is prepared (see FIG. 7). A silicon single crystal substrate having a p-type well region is preferably usable as the substrate 100. The element isolating region 101 is formed on the substrate 100 between the memory cell array 2 and the peripheral circuit, between semiconductor elements constituting the peripheral circuit, and so on. When making the element isolating region 101, the substrate 100 undergoes the reactive etching (RIE) process in order to make the trench 101A. The trench 101A is in the main surface of the substrate 100. Thereafter, the insulator 10B is embedded in the trench 101A. Now, the element isolating region 101 is completed.

A part of the source line 51 is made where the memory cell array 2 is formed as shown in FIG. 7. For this purpose, n-type impurities are doped into the main surface of the substrate 100, and are activated. The ion implanting process, solid phase diffusion or the like is applicable.

Next, the select transistor 24 is made on the forming region of the memory cell array 2. An insulating film 2401, the control electrode 241, an insulating film 2402, and an insulating film 2403 are sequentially stuck on the main surface of the substrate 100 (on the source line 51), and are patterned (as shown in FIG. 7). To make the n-channel conductive IGFET 26 on an area for the peripheral circuit, the gate insulator film 262; control electrode 261; an insulating film 2602; and an insulating film 2603 are sequentially stuck and are patterned. The insulating film 2401 and gate insulator film 262 are formed in the same fabricating process, and are made of silicon oxide films which are approximately 40 nm to 60 nm thick, for instance. The control electrodes 241 and 261 are formed in the same fabricating process, and are made of silicon poly-crystal films which are approximately 180 nm to 220 nm thick, for instance. The insulating films 2402 and 2602 are formed in the same fabricating process, and are made of tetra-etoxy-silane (TEOS) films which are approximately 10 nm to 30 nm thick, for instance. The insulating films 2403 and 2603 are formed in the same fabricating process, and are made of silicon nitride films which are 80 nm to 120 nm thick and are used as cap insulating film, for instance.

At the peripheral circuit forming region, a part of the main electrode region 264 and a part of the principal electrode region 245 are made on the principal surface of the substrate 100, i.e. on the opposite sides of the control electrode 261 of the n-channel conductive IGFET 26. Refer to FIG. 7. No reference numerals are assigned to these parts. The foregoing parts of the main electrode regions 264 and 265 have low impurity concentrations, extend to the channel forming region 263, and are structured as an extension or an LDD (lightly doped drain). For instance, the parts of the main electrode regions 264 and 265 are made by ion-implanting n-type impurities using the insulating film 2603 (actually using a patterning mask, not shown). The n-type impurities are implanted into the main surface of the substrate 100 at the opposite side of the control electrode 241 at the forming region of the memory cell array 2.

At the area for the peripheral circuit, a side wall spacer 2605 is formed on a side wall of the control electrode 261 of the n-channel conductive IGFET 26 (see FIG. 7). In the area for memory cell array 2, a side wall spacer 2405 is formed on a side wall of the control electrode 241. The side wall spacer 2605 is made together with the side wall spacer 2405 in the same fabricating process. For this purpose, a TEOS film is deposited, and is then subject to the anisotropic etching such as the reactive ion etching (RIE), thereby forming the side wall spacers 2605 and 2405. Thereafter, at the area for the peripheral circuit, n-type impurities having a high concentration are doped into opposite sides of the control electrode 261, thereby making main electrode regions 264 and 265. In this state, the n-channel conductive IGFET 26 is completed. The n-type impurities are doped into the main surface of the substrate 100 at the opposite sides of the control electrode 241 at the area for the memory cell array 2.

An insulating film 110 is made on the insulating films 2403 and 2603 extending all over the substrate 100 (i.e. over the areas for the memory cell array 2 and the peripheral circuit). Then, a flat insulating film 111 is made on the insulating film 110. For instance, the insulating film 110 is preferably a silicon nitride film which can function as a barrier. The insulating film 111 is preferably a silicon oxide film which can function as an interlayer dielectric. The insulating film 111 has its surface flattened by the chemical-mechanical polishing (CMP) process, which enables the insulating film 110 under the insulating film 111 to be used as a stop.

Figure 8:
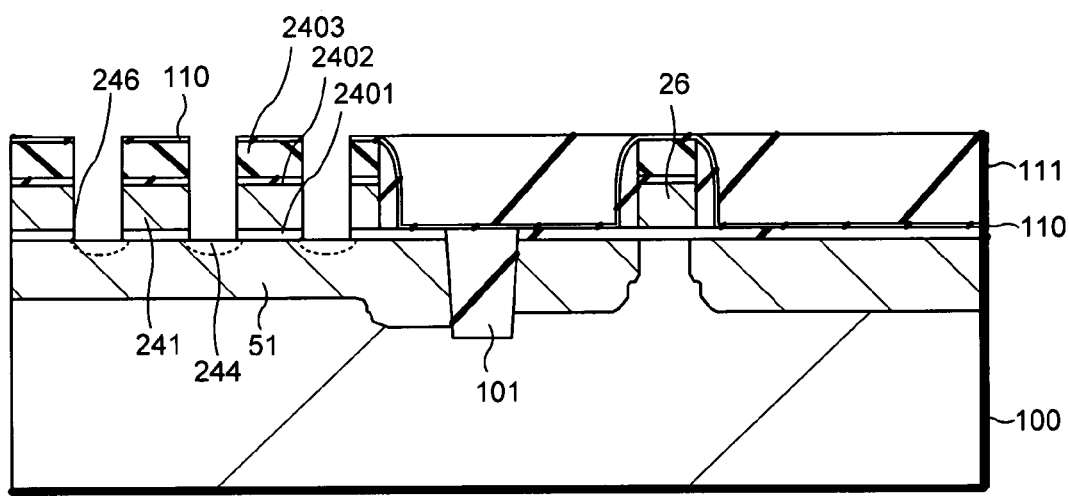
FIG. 8 is a cross section showing how the nonvolatile semiconductor memory is fabricated in a second fabricating process.

At the area for the memory cell array 2, the through-hole (memory hole) 246 is made through the insulating films 110, 2403 and 2402, control electrode 241 and insulating film 2401, so that the surface of the source line 51 will be exposed. The through-hole 246 is positioned where the memory cell units 20 are arranged in the shape of a matrix. Refer to FIG. 8. The anisotropic etching such as RIE is applicable to making the through-hole 246. The through-hole 246 is cylindrical, and has an inner diameter of 20 nm to 150 nm, for instance. The main surface of the source line 51 is covered by n-type impurities doped via the through-hole 246. The n-type impurities are activated in order to make the main electrode region (source region) 244 of the select transistor 24 as shown in FIG. 8. The main electrode region 244 is made of a conductive material same as that of the source line 51, and is electrically connected to the source line 51. For instance, the n-type impurities are As (arsenic), and are doped into the principal surface of the source line 51 by the ion implantation process. As the n-type impurities, a dose of arsenic (As) of $3 \times 10^{15}$ atoms/cm$^2$ is implanted by applying energy of 25 keV to 45 keV. Alternatively, the activated n-type impurities may be annealed in a succeeding fabrication process.

Figure 9:
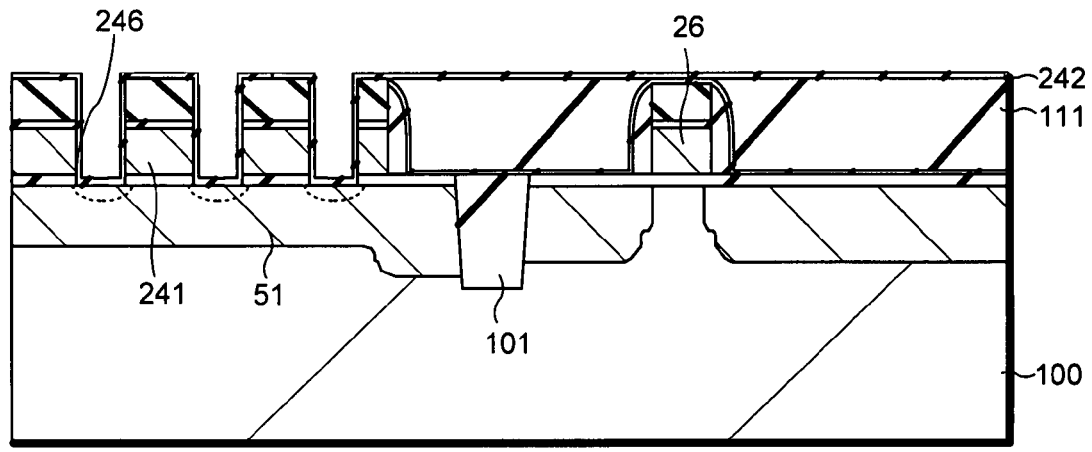
FIG. 9 is a cross section showing how the nonvolatile semiconductor memory is fabricated in a third fabricating process.

Referring to FIG. 9, the gate insulating film 242 is formed on the side wall of the control electrode 241 in the through-hole 246. Specifically, the gate insulating film 242 is made of a silicon oxide film which is formed by a process such as the low pressure chemical vapor deposition (LPCVD), and is 5 nm to 20 nm thick. In this first embodiment, the silicon oxide film is applied all over the substrate 100.

A first conductive material 243a is applied onto the side wall of the control electrode 241 in the through-hole 246, serves as an etching mask used for selectively removing the gate insulating film 242, and makes the channel forming region 243 for the select transistor 24. The first conductive material 243a is an amorphous silicon film which is prepared by the CVD process, and is 10 nm to 20 nm thick, for instance. Alternatively, the first conductive material 243a may be a poly-crystal silicon film. However, the amorphous silicon film is preferable since it has no grain boundary, and can suppress unnecessary diffusion of impurities for controlling resistance values.

Figure 11:
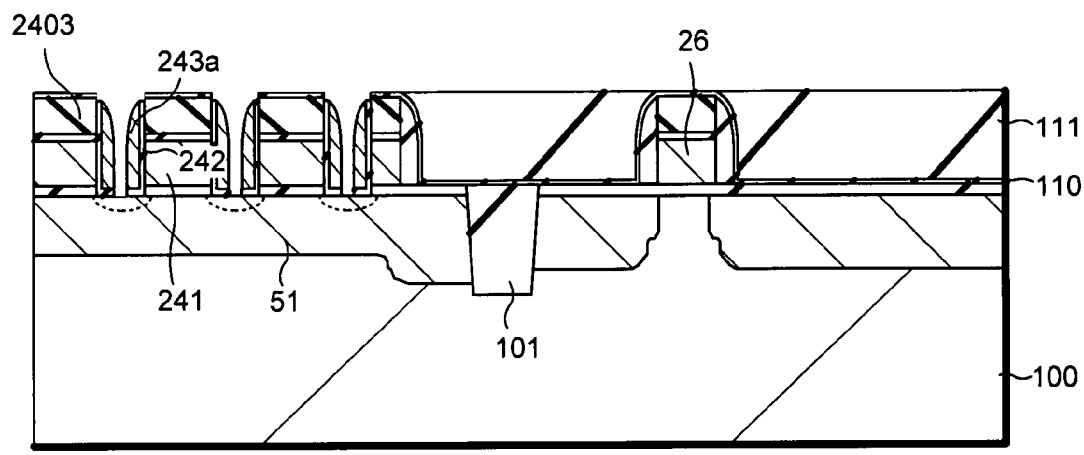
FIG. 11 is a cross section showing how the nonvolatile semiconductor memory is fabricated in a fifth fabricating process.

A side wall spacer (243a) made of the first conductive material 243a is formed on the gate insulating film 242 on the inner surface of the through-hole 246 (as shown in FIG. 11). For this purpose, the first conductive material 243a is subject to the anisotropic etching such as the RIE. The side wall spacer enables the surface of the gate insulating film 242 (at the bottom of the through-hole 246) to be exposed. Further, the side wall spacer is present only at a step of the through-hole 246. The first conductive material 243a at the other part of the insulating film 111 is removed when making the side wall spacer.

The exposed gate insulating film 242 is removed from the bottom of the through-hole 246, so that the surface of the main electrode region 244 (source line 51) is exposed in an area defined by the side wall spacer in the through-hole 246. Specifically, the gate insulating film 242 is subject to the anisotropic etching such as the RIE or the isotropic etching using the side wall spacer, insulating film 2403, insulating film 111 and so on as an etching mask.

Figure 12:
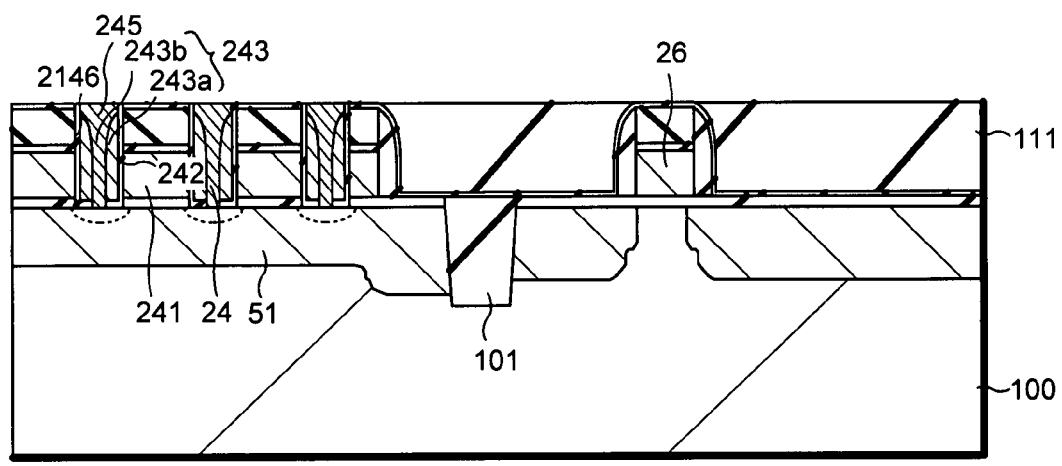
FIG. 12 is a cross section showing how the nonvolatile semiconductor memory is fabricated in a sixth fabricating process.

As shown in FIG. 12, the second conductive material 243b is made in the through-hole 246, and is electrically connected to the main electrode region 244 at the bottom of the through-hole 246. The second conductive material 243b and the first conductive material 243a (side wall spacer) constitute the channel forming region 243 of the select transistor 24. For instance, the second conductive material 243b is preferably an amorphus silicon film which is prepared by the CVD process and is thick enough to completely have the through-hole 246 therein. The second conductive material 243b is subject to the CMP in order to have its surface polished. In this first embodiment, the second conductive material 243b is flush with the insulating film 2403.

N-type impurities are doped into the second conductive material 243b (and the first conductive material 243a), thereby forming the channel forming region 243 and the main electrode region (e.g. drain region) 245. As the n-type impurities, a dose of phosphorus (P) of $3 \times 10^{11}$ atoms/cm$^2$ to $7 \times 10^{11}$ atoms/cm$^2$ is implanted by applying energy in three steps, e.g. approximately 210 keV to 230 keV, approximately 240 keV to 260 keV, and approximately 270 keV to 290 keV. The channel forming region 243 longitudinally extends on the substrate 100 and has a uniform concentration of the n-type impurities which longitudinally and uniformly extend over the substrate 100. To form the main electrode region 245, a dose of arsenic (As) of $2\times10^{15}$ atoms/cm$^2$ to $4\times10^{15}$ atoms/cm$^2$ is implanted by applying energy of 30 keV to 50 keV. The n-type impurities are activated by the rapid thermal annealing process (RTA).

Figure 13:
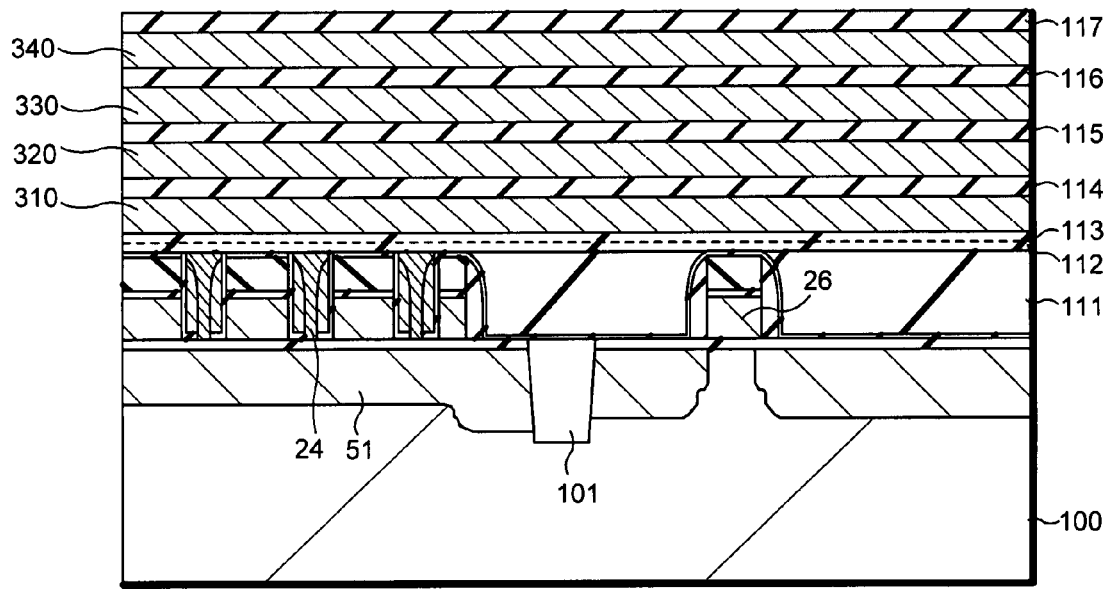
FIG. 13 is a cross section showing how the nonvolatile semiconductor memory is fabricated in a seventh fabricating process.

The insulating films 112 and 113 are sequentially formed on the insulating film 111 extending over the substrate 100 (including the memory cell array 2 and the peripheral circuit) as shown in FIG. 13. The insulating films 112 and 113 are used as etching stops when the through-holes (memory holes) for the memory cell strings are made. The insulating film 112 is preferably a TEOS film while the insulating film 113 is preferably a silicon nitride film.

As shown in FIG. 13, a conductive film 310, an insulating film 114, a conductive film 320, an insulating film 115, a conductive film 330, an insulating film 116, a conductive film 340, and an insulating film 117 are sequentially laid over the insulating film 113 on the substrate 100. The conductive films 310, 320, 330 and 340 serve as word lines 31, 32, 33 and 34, and are preferably made of gate electrode materials such as amorphous silicon films which are approximately 20 nm to 150 nm thick. The amorphous silicon films are prepared by the CVD process, for instance. The insulating films 114 to 117 are used as interlayer dielectrics, and are preferably silicon oxide films which are 20 nm to 150 nm thick and are prepared by the CVD process, for instance. The four conductive films 310, 320, 330 and 340 are used in this first embodiment. Alternatively, the number of conductive films may be variable depending upon the number of memory cells arranged for the memory string. For instance, if eight memory cells are arranged for the memory string 21, eight conductive films will be laid one over after another. Further, sixteen conductive films will be used for sixteen memory cells.

Figure 14:
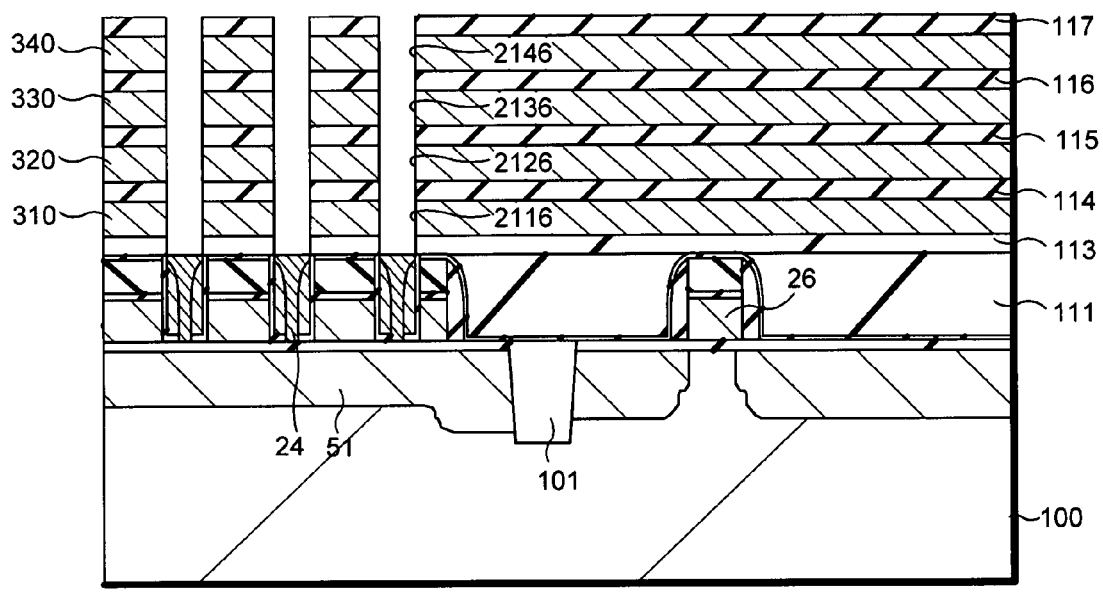
FIG. 14 is a cross section showing how the nonvolatile semiconductor memory is fabricated in an eighth fabricating process.

Referring to FIG. 14, through-holes (memory holes) 2116, 2126, 2136 and 2146 are made in the area where the memory cell units 20 are arranged on the main electrode region 245 of the select transistor 24 in the region for forming the memory cell array 2. Specifically, the through-hole 2116 is present in the conductive film 310; the through-hole 2126 is present in the conductive film 320; the through-hole 2136 is present in the conductive film 330; and the through-hole 2146 is present in the conductive film 340. In order to make the through-holes 2116, 21226, 2136 and 2146, the conductive films 340, 330, 320 and 310 are respectively subject to the anisotropic etching such as RIE using etching masks prepared by the photolithographic process. When making the through-hole 2116, insulating films 117 to 114 are sequentially etched. Insulating films 113 and 112 as a base for the conductive film 310 are used as etching stops when making the through-hole 2116 in the lowermost conductive film 310. Thereafter, the insulating films 113 and 112 are sequentially removed using the through-hole 2116 as an etching mask, so that the surface of the main electrode region 245 of the select transistor 24 is exposed. Each of the through-holes 2116, 21226, 2136 and 2146 is cylindrical and has a diameter of 20 nm to 150 nm, for instance.

Figure 15:
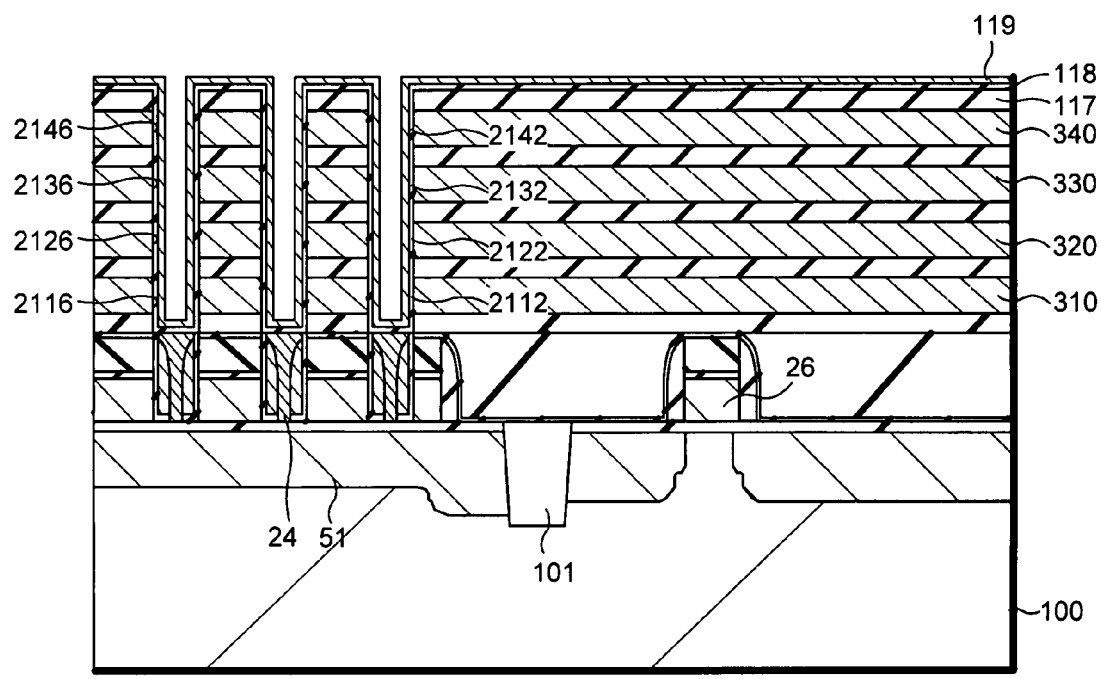
FIG. 15 is a cross section showing how the nonvolatile semiconductor memory is fabricated in a ninth fabricating process.
Figure 16:
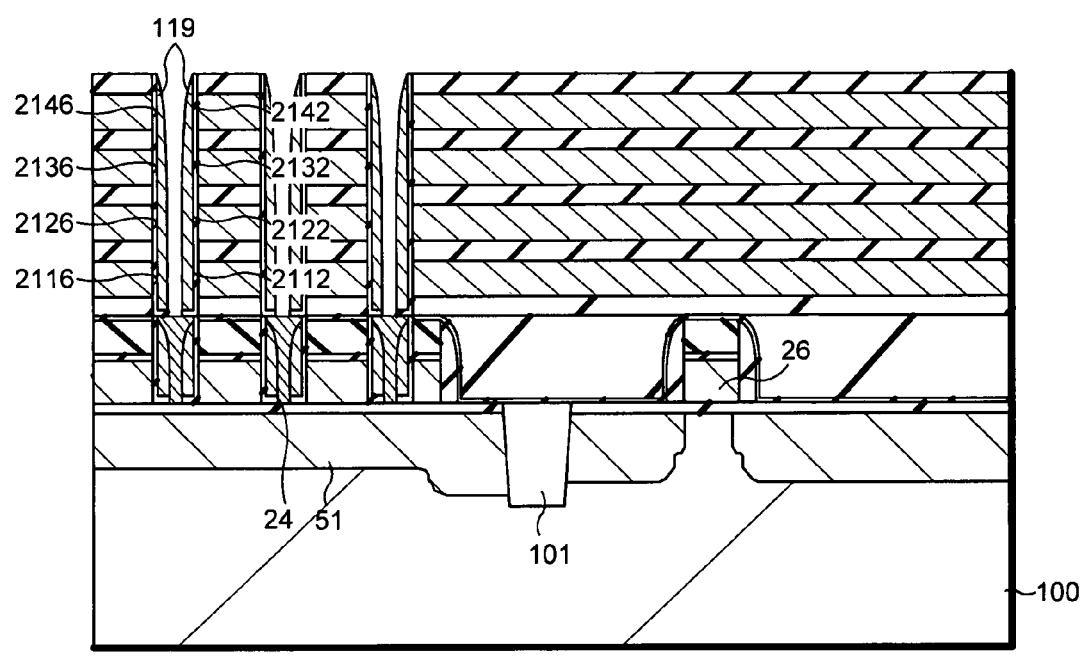
FIG. 16 is a cross section showing how the nonvolatile semiconductor memory is fabricated in a tenth fabricating process.

A charge accumulating film 118 is formed not only all over the insulating film 117 but also over at least the conductive film 310 (on the inner wall of the through-hole 2116), the conductive film 320 (on the inner wall of the through-hole 2126), the conductive film 330 (on the inner wall of the through-hole 2136), and the conductive film 340 (on the inner wall of the through-hole 2146) as shown in FIG. 15. The charge accumulating film 118 is used as: a charge accumulating region 2112 in the memory cell 211; as a charge accumulating region 2122 in the memory cell 212; as a charge accumulating region 2132 in the memory cell 213; and as a charge accumulating region 2142 in the memory cell 214. Further, the charge accumulating film 118 functions as tunnel insulators and gate insulator films in the memory cells 212 to 214. The memory cells 212 to 214 have the SANOS structure. The charge accumulating film 118 is constituted by an alumina film ($Al_2O_3$) which is approximately 8 nm to 12 nm thick, a silicon nitride film which is approximately 8 nm to 12 nm thick, and a silicon oxide film which is approximately 3 nm to 5 nm thick. These films are stuck one after another. In the charge accumulating film 118, a border between the silicon nitride film and the silicon oxide film functions as the charge accumulating regions. Further, the silicon oxide film functions as the tunnel insulators and gate insulator films.

The conductive film 119 is made on the charge accumulating region 118 as shown in FIG. 15, and functions as a part of the channel forming region 2113 of the memory cell 211, a part of the channel forming region 2123 of the memory cell 212, a part of the channel forming region 2133 of the memory cell 213, and a part of the channel forming region 2143 of the memory cell 214. Further, the conductive film 119 functions as an etching mask when making the through-hole for electrically connecting the memory cell 211 and the select transistor 24. For instance, the conductive film 119 is preferably an amorphous silicon film which is approximately 8 nm to 15 nm thick.

The conductive film 119 is subject to the anisotropic etching such as RIE, but is left, as side wall spacers, on the inner walls (side walls) of the through-holes 2116, 2126, 2136 and 2146. Specifically, the conductive film 119 is removed from a flat part around the through-hole 2126 and from the upper part of the main electrode region 245 of the select transistor 24 in the through-hole 2126 when the side wall spacers are made. Thereafter, the insulating film 118 exposed around the conductive film 119 is removed using the conductive film 119 as an etching mask (see FIG. 16). The anisotropic etching such as the RIE is preferably used to remove the insulating film 118, for instance. Especially, the insulating film 118 on the main electrode region 245 of the selector transistor 245 is removed in the through-hole 2116, so that a through-hole (no reference numeral assigned) is made in order to electrically connect the memory cell 211 of the memory string 21 and the select transistor 24. Then, impurities are doped into the conductive film 119 used as the side wall spacer. When used as a part of the channel forming region, the impurities reduce a resistance value of the conductive film 119. The impurities are phosphorus (P), and are doped onto the substrate 100 in a dose of $1\times10^{11}$ atoms/cm$^2$ to $3\times10^{11}$ atoms/cm$^2$ by applying energy of approximately 4 keV to 6 keV. For instance, the impurities are applied to the conductive film 119 (on the substrate 100) at an appropriate angle other than 90° from the four directions.

Figure 17:
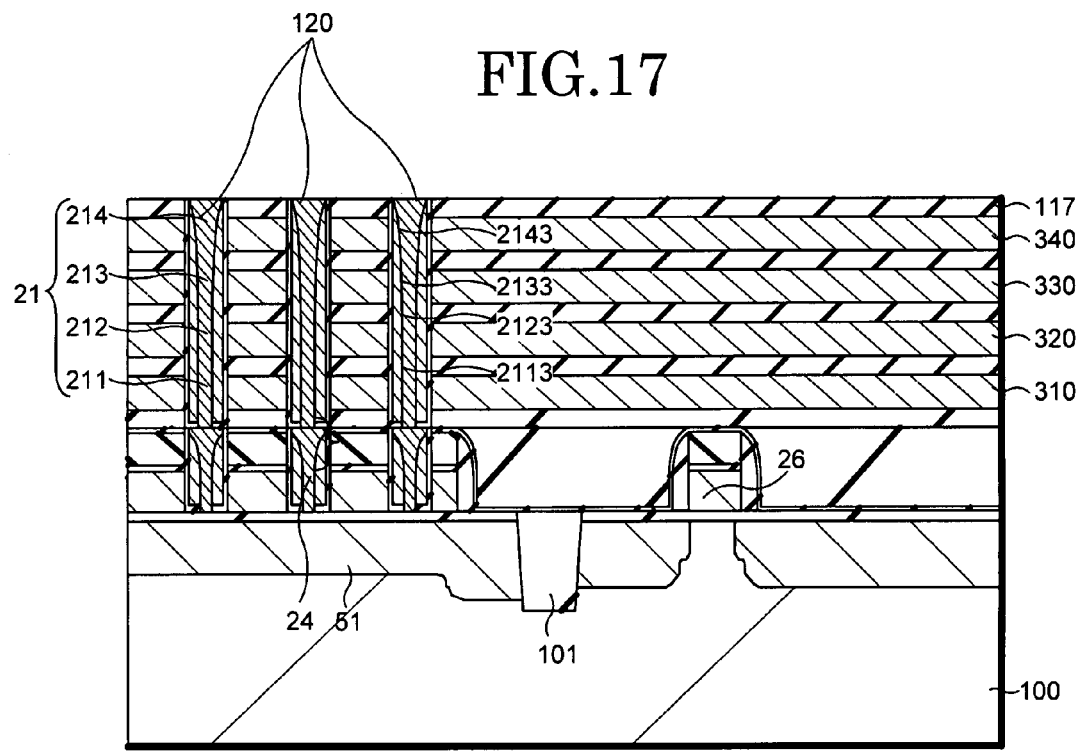
FIG. 17 is a cross section showing how the nonvolatile semiconductor memory is fabricated in an eleventh fabricating process.

Referring to FIG. 17, the conductive film 120 is formed on the area for the memory cell array 2 in order fill the through-holes 2116, 2126, 2136 and 2146. Specifically, the conductive film 120 is applied all over the insulating film 117 in order to completely fill the through-holes 2116 to 2146. The conductive film 120 is preferably an amorphous silicon film prepared by the CVD process. The conductive film 120 is flattened by the CMP or etching process until the surface of the insulating film 117 is exposed. After the flattening process, n-type impurities are doped into the conductive film 120 in order to reduce the resistance or to form the main electrode region (e.g. the drain region) of the memory cell 214. For instance the impurities are As (arsenic), and are doped into the conductive film 120 and in a dose of $3\times10^{15}$ atoms/cm$^2$ to $7\times10^{15}$ atoms/cm$^2$ by applying energy of approximately 35 keV to 45 keV. The n-type impurities are activated by performing the RTA at approximately 950 degrees Celsius to 970 degrees Celsius and for 8 seconds to 12 seconds. The conductive film 120 is used as the channel forming region 2113 in the memory cell 211, as the channel forming region 2124 in the memory cell 212, as the channel forming region 2133 in the memory cell 213, and as the channel forming region 2143 in the memory cell 214. In this state, the memory string 21 having the memory cells 211, 212, 213 and 214 is completed.

As shown in FIG. 18, the word line 30 is formed in the region for forming the memory cell array 20, and/or the part of the region for forming the peripheral circuit as described hereinafter. First of all, a mask 121*a* is made on the insulating film 117 by the photolithography process, and is used as an etching mask, thereby sequentially patterning the insulating film 117, uppermost conductive film 340, insulating film 116, conductive film 330, insulating film 115, conductive film 320, insulating film 114, and lowermost conductive film 310. The word line 31 is made using the conductive film 310. The anisotropic etching such as RIE is used for the patterning process, for instance. The mask 121*a* is a photoresist film which can withstand a plurality of the patterning processes, and is approximately 3 μm to 4 μm thick. The mask 121*a* is positively side-etched and is slimmed in order to make a mask 121*b* which is smaller than the mask 121*a*. Specifically, the mask 121*a* is side-etched to an extent so that a connection space is obtained at the periphery of the word line 31 and a wiring to be placed on the word line 31. The mask 121*a* (together with 121*b*, 121*c* and 121*d*) is depicted by broken lines in FIG. 18.

The mask 121*b* is used as an etching mask in order to sequentially make the insulating film 117, conductive film 340, insulating film 116, conductive film 330, insulating film 115, and conductive film 320. The conductive film 320 is used to make the word line 32. The anisotropic etching process is also adopted for the patterning. Then, the mask 121*b* is slimmed to make the mask 121*c*. The mask 121*c* is used as an etching mask in order to sequentially pattern the insulating film 117, uppermost conductive film 340, insulating film 116, and conductive film 330. The conductive film 330 is used to make the word line 33. The anisotropic etching process is also adopted for the patterning. Then, the mask 121*c* is slimmed to make the mask 121*d*. The mask 121*d* is used as an etching mask in order to sequentially pattern the insulating film 117, and conductive film 340. The conductive film 340 is used to make the word line 33. The anisotropic etching process is also adopted for the patterning. After the foregoing processes, the word line 30 is completed in the shape of a step or a pyramid, i.e. the word line 30 is tapered from the lowermost word line 31 to the uppermost word line 34. The word line 31 is integral with the control electrode 2111 of the memory cell 211, so that the control electrode 2111 is completed when the word line 31 is completed. Similarly, the control electrode 2121 of the memory cell 212 is completed together with the word line 32; the control electrode 2131 of the memory cell 213 is completed together with the word line 33; the control electrode 2141 of the memory cell 214 is completed together with the word line 34. The amorphous silicon films are used to constitute the control electrode 241 of the select transistor 24; select signal line connected to the control electrode 241; control electrode 2111 of the memory cell 211; word line 31 connected to the control electrode 2111; control electrode 2121 of the memory cell 212; word line 32 connected to the control electrode 2121; control electrode 2131 of the memory cell 213; word line 33 connected to the control electrode 2131; and control electrode 2141 of the memory cell 2141; and word line 34 connected to the control electrode 2141. The amorphous silicon films are finally thermally treated to change to poly crystal silicon films.

Figure 19:
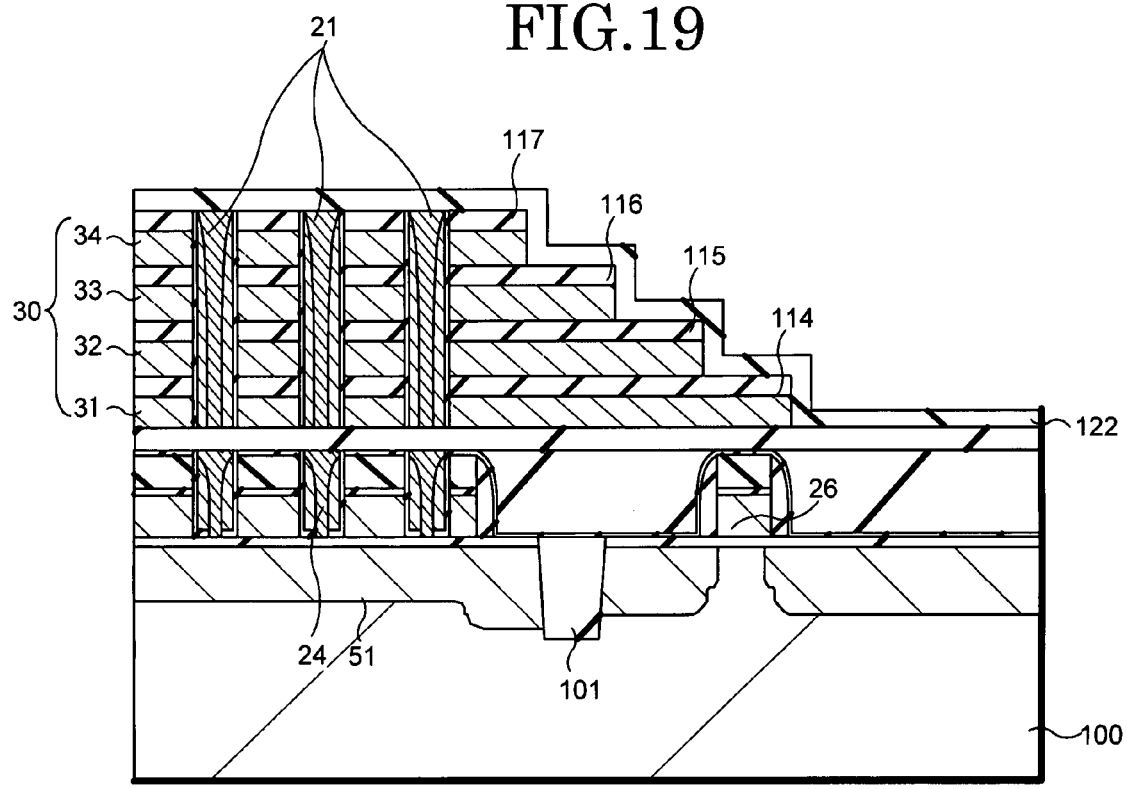
FIG. 19 is a cross section showing how the nonvolatile semiconductor memory is fabricated in a thirteenth fabricating process.

As shown in FIG. 19, the insulating film 122 is formed all over the substrate 100 including the side surface of the word line 31, insulating film 114, side surface of the word line 32, insulating film 115, side surface of the word line 33, insulating film 116, side surface of the word line 34 and insulating film 117. The insulating film 122 extends over the area for the memory cell array 2 and the area for the peripheral circuit. The insulating films 122 is used as an etching stop when making a through-hole (memory hole) for electrically connecting the word line 30 and a wiring above the word line 30. The insulating film 122 is preferably a silicon nitride film, for instance.

Figure 20:
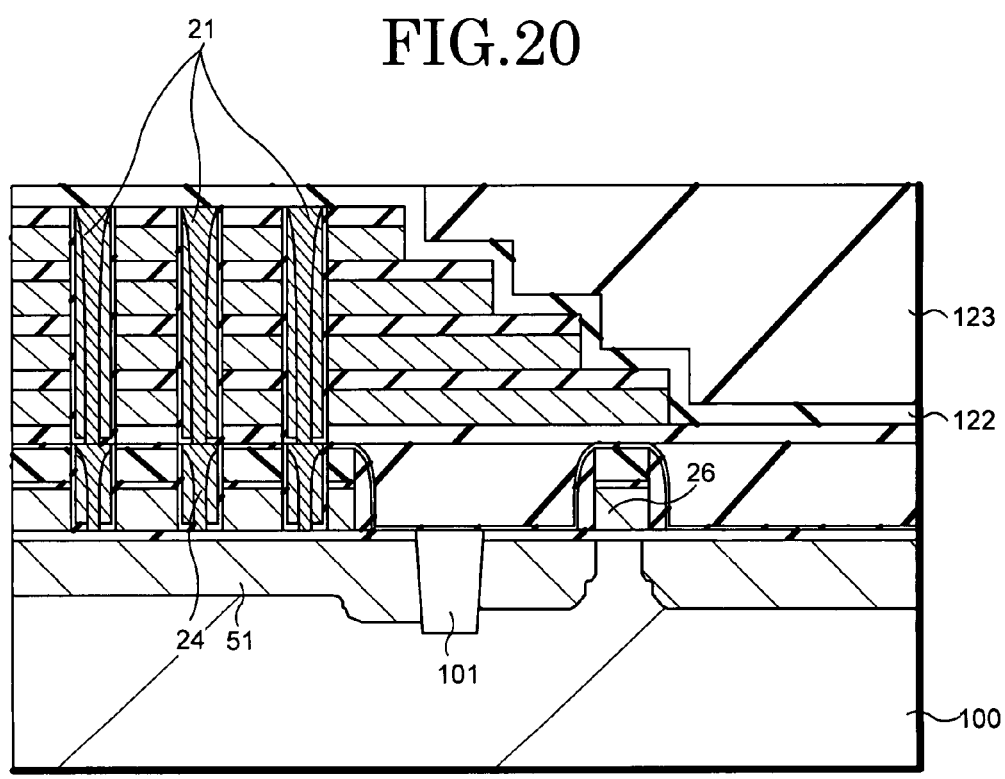
FIG. 20 is a cross section showing how the nonvolatile semiconductor memory is fabricated in a fourteenth fabricating process.

Referring to FIG. 20, the insulating film 123 is formed all over the substrate 100 in order to fill a stepwise space over the word line 30 on the area for the memory cell array 2. Further, the insulating film 123 extends over the area for the peripheral circuit. The insulating film 123 is thick enough to cover the word line 30, and is flattened to become flush with the top surface of the insulating film 122. The CMP process is applied to the flattening process.

Figure 21:
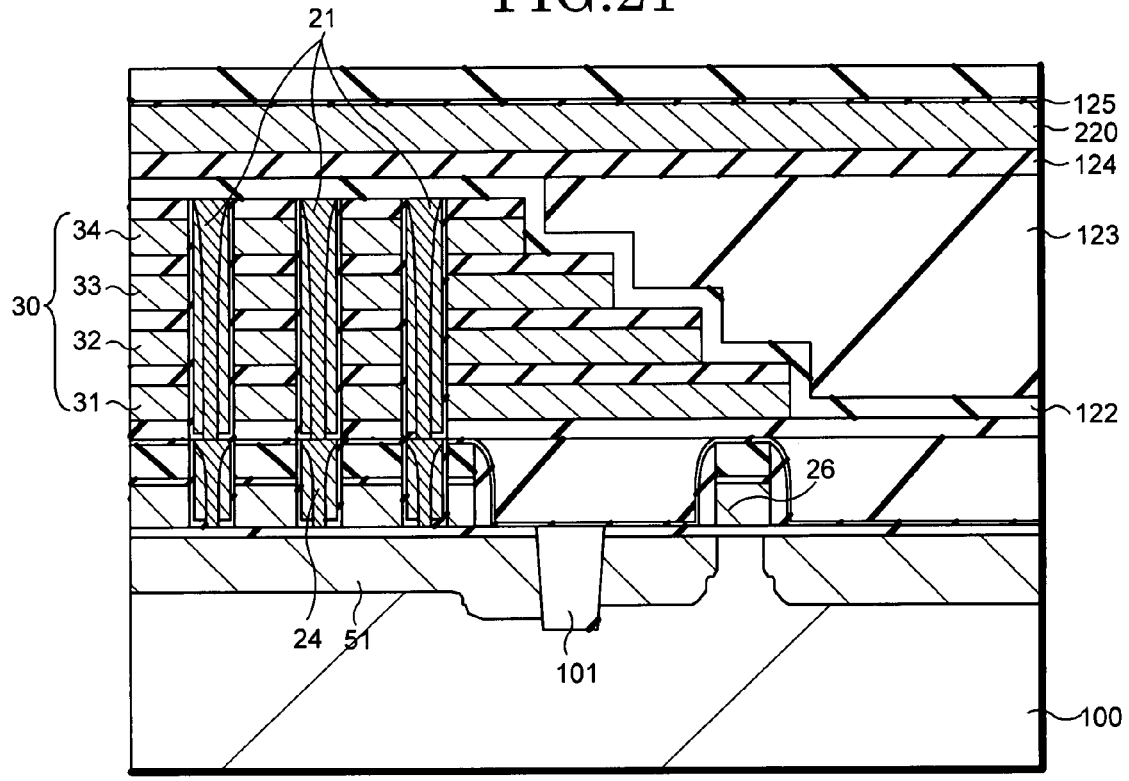
FIG. 21 is a cross section showing how the nonvolatile semiconductor memory is fabricated in a fifteenth fabricating process.

The first select transistor 22, first select signal line 71, second select transistor 23, and second select signal line 72 will be made next. First of all, An insulating film 124, a conductive film 220, an insulating film 125 and an insulating film 126 are sequentially stuck all over the area for the memory cell array 2 on the substrate 100 including the insulating films 122 and 123 in order to make the first select transistor 22 and the first select signal line 71. Refer to FIG. 21. The insulating film 124 is a silicon oxide film which is prepared by the CVD process, and is 40 nm to 60 nm thick. The conductive film 220 is used to form the control electrode 221 of the first select transistor 22 and the first select signal line 71, and is a poly crystal silicon film which is prepared by the CVD process and is approximately 100 nm to 300 m thick. The insulating film 125 is a TEOS film prepared by the CVD process and having a thickness of 10 nm to 30 nm, for instance. The insulating film 126 is a silicon nitride film which is prepared by the CVD process or sputtering process, and is 50 nm to 150 nm thick.

Figure 26:
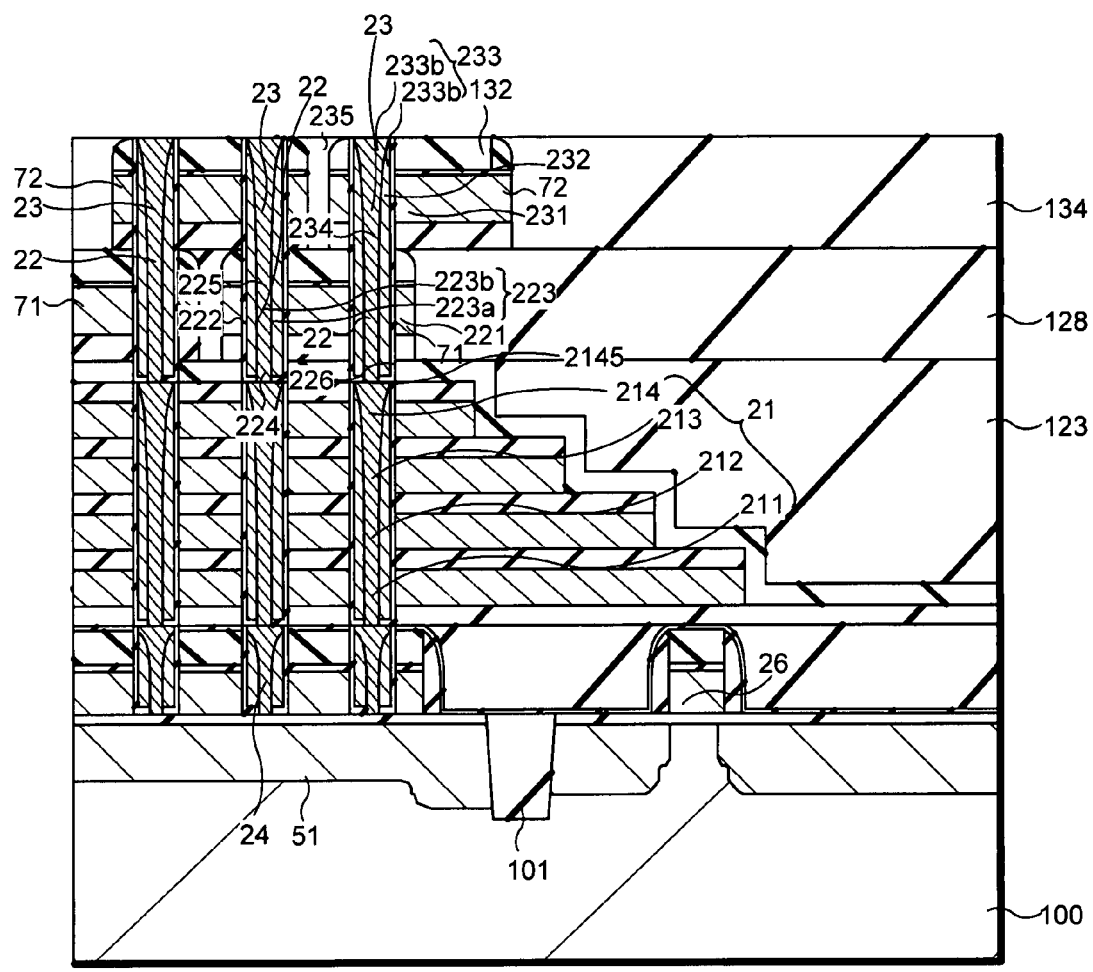
FIG. 26 is a cross section showing how the nonvolatile semiconductor memory is fabricated in a twentieth fabricating process.

The uppermost insulating film 126 is patterned, and is left at the area for the first select transistor 22 and the area for the first select signal line 71. Refer to FIG. 26. Specifically, the insulating film 126 is patterned by the anisotropic etching such as the RIE using a mask (not shown) which is prepared on the insulating film 126 by the photolithographic process. The insulating film 126 extends across two memory cell units 20 which are adjacent along the data line 50 (shown in FIG. 1), and functions as the first select transistor 21 and the first select signal line 71.

Figure 23:
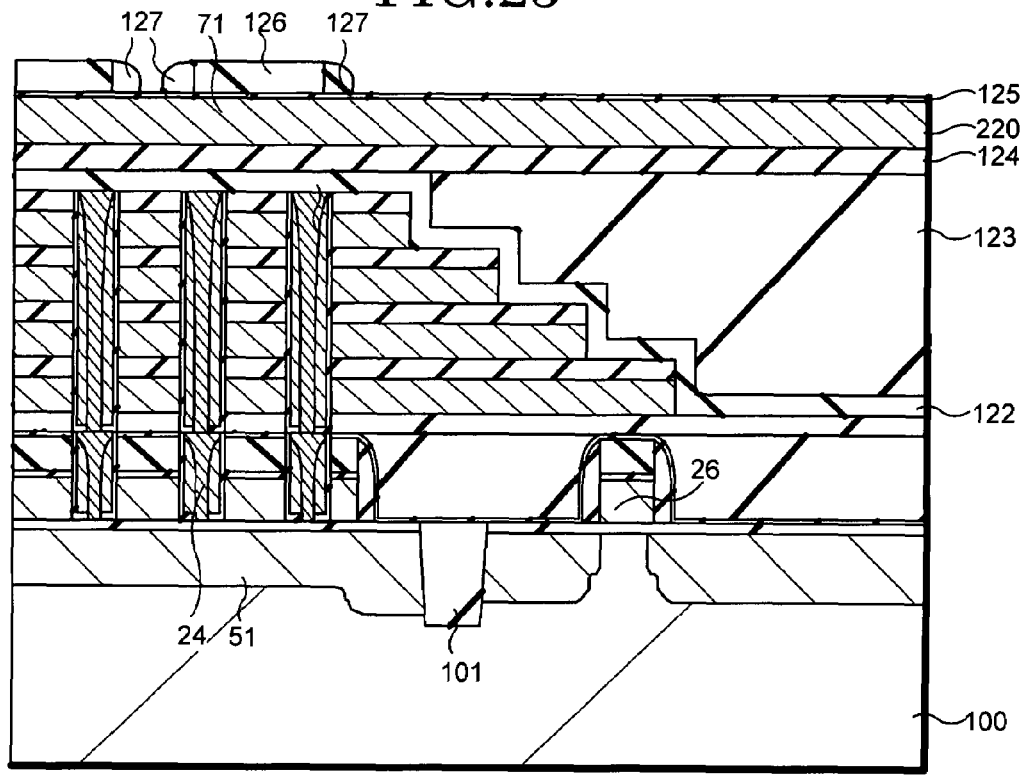
FIG. 23 is a cross section showing how the nonvolatile semiconductor memory is fabricated in a seventeenth fabricating process.

As shown in FIG. 23, side wall spacers 127 are made on opposite side walls of the insulating film 126. Specifically, the side wall spacers 127 are made by depositing an insulating film on the insulating film 126, and is subject to the RIE or the like so as to be flush with the insulating film 126. Therefore, the side wall spacers 127 remain on the side walls of the insulating film 126. The side wall spacers 127 are preferably a silicon nitride film which is prepared by the CVD or sputtering process, and is approximately 20 nm to 40 nm thick, for instance. The side wall spacers 127 can increase a width of the insulating film 126, or a wiring width of the first select signal line 71, compared with a minimum wiring size accomplished by the photolithographic process.

Figure 24:
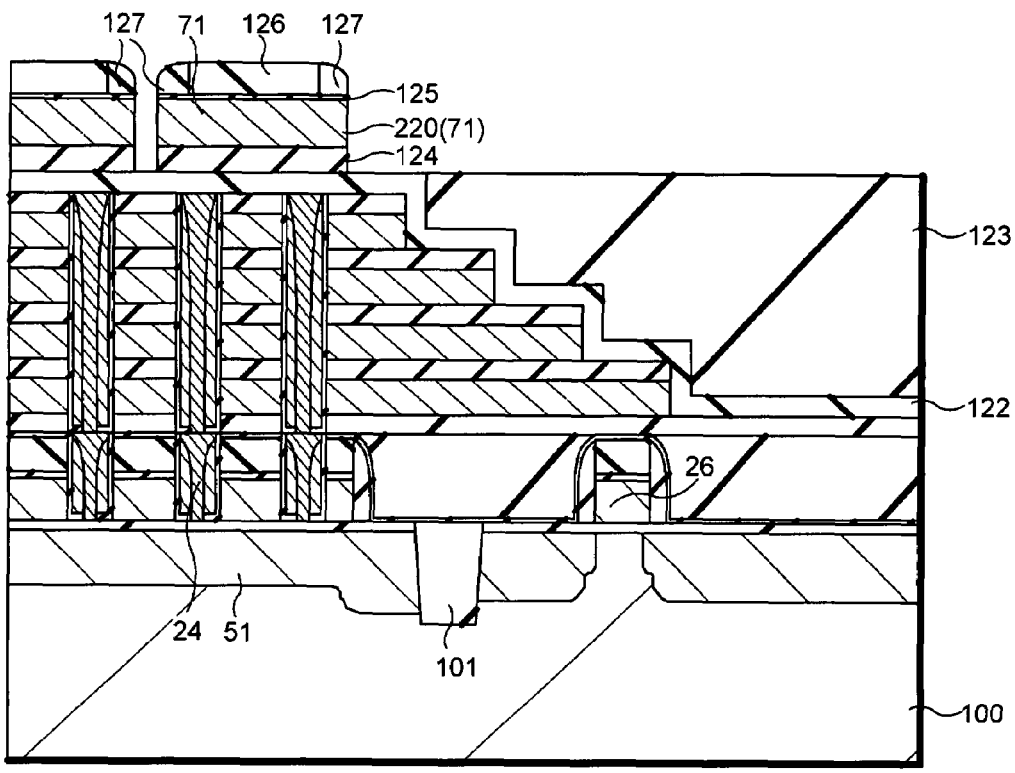
FIG. 24 is a cross section showing how the nonvolatile semiconductor memory is fabricated in an eighteenth fabricating process.
Figure 25:
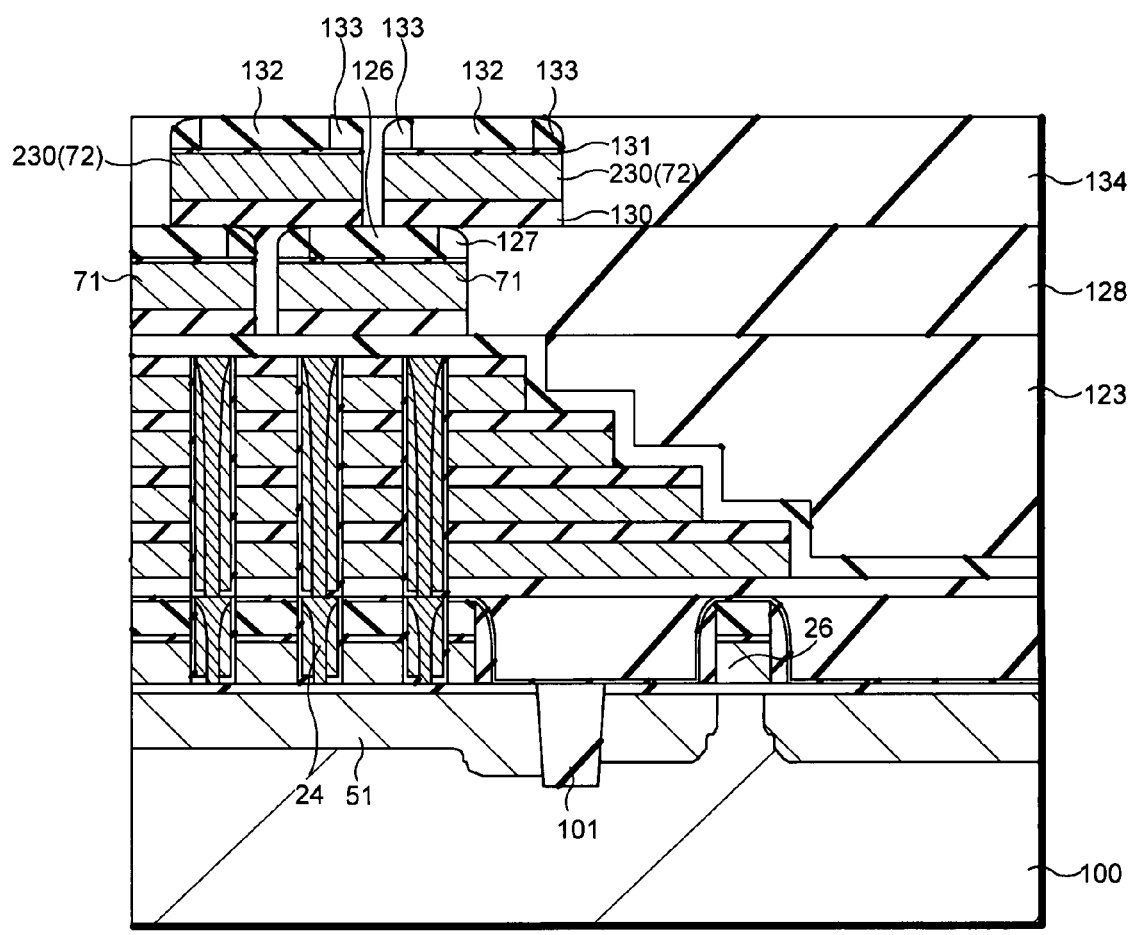
FIG. 25 is a cross section showing how the nonvolatile semiconductor memory is fabricated in a nineteenth fabricating process.

The insulating film 126 and side wall spacers 127 are used as etching masks in order to sequentially pattern the insulating film 125, conductive film 220 and insulating film 124. Refer to FIG. 24. Therefore, the first select signal line 71 is made using the conductive film 220. The RIE or the like is applicable to the patterning process. Thereafter, an insulating film 128 is formed around the first select signal line 71 (as shown in FIG. 25). The insulating film 128 is thick enough to completely cover the peripheral surface of the first select signal line 71, and is then flattened by the CMP process or the like so that the insulating film 126 on the first select signal line 71 is exposed.

In order to make the second select transistor 23 and the second select signal line 72, the insulating film 130, conductive film 230, insulating film 131, and insulating film 132 are sequentially stuck all over the substrate 100 including the insulating films 126 and 128 as shown in FIG. 25. For this purpose, the process shown in FIG. 21 is also applied. The insulating film 130 is a silicon oxide film which is prepared by the CVD and is 40 nm to 60 nm thick, for instance. The conductive film 230 is made of a gate electrode material such as a silicon poly-crystal film which is prepared by the CVD process and is approximately 100 nm to 300 nm thick, and is used to make the control electrode 231 of the second select transistor 23 and the second select signal line 72. The insulating film 131 is a TEOS film which is prepared by the CVD process or the sputtering process, and is approximately 50 nm to 150 nm thick.

Figure 22:
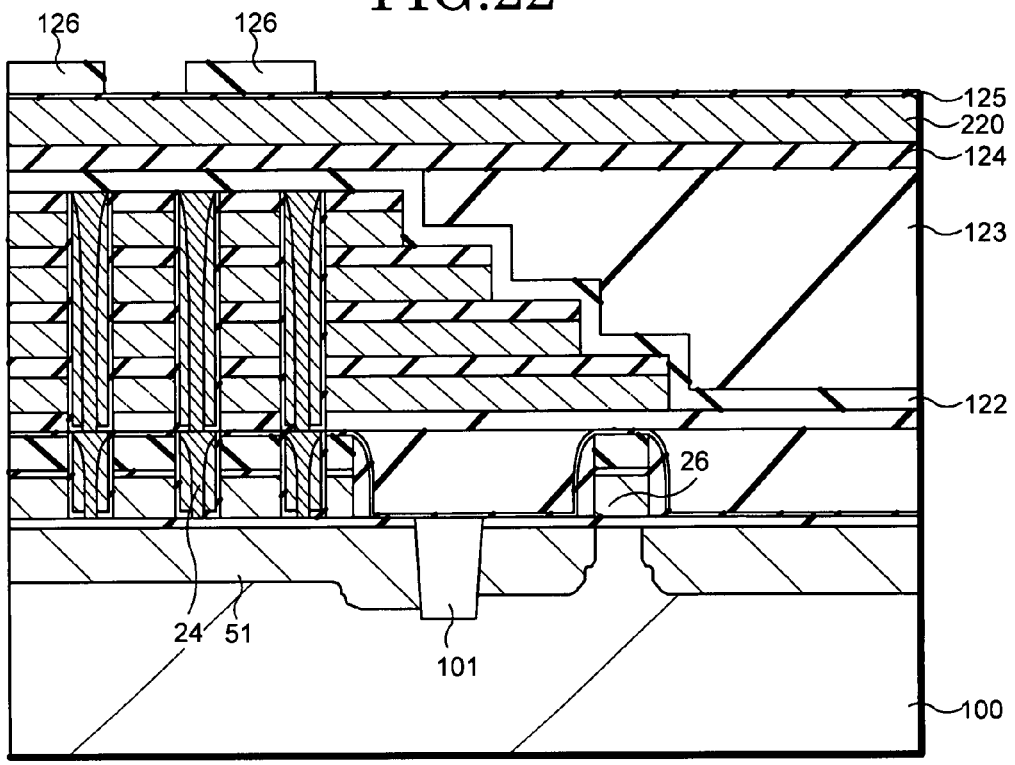
FIG. 22 is a cross section showing how the nonvolatile semiconductor memory is fabricated in a sixteenth fabricating process.

The insulating film 132 at the top is patterned by the process shown in FIG. 22, and is removed except for the area where the second select transistor 23 and the first select signal line 71 are formed as shown in FIG. 25. The photolithographic process or etching process is used in order to pattern the insulating film 132. The insulating film 132 remains intact across two adjacent memory cell units 20 extending along the data line 50 (shown in FIG. 1), is displaced by a half pitch with respect to the insulating film 126 (a mask for making the first select transistor 22 and the first select signal line 71), and functions as a mask for making the second select transistor 23 and the second signal line 72.

The side wall spacer 133 (shown in FIG. 25) is made on a side wall of the insulating film 132 by the process shown in FIG. 23. (Refer to FIG. 25.) Specifically, an insulating film is deposited on the insulating film 132, and is subject to the anisotropic etching process such as the RIE so that the side wall 133 is left only on the side wall of the insulating film 132. The side wall spacer 133 is preferably a silicon nitride film prepared by the CVD or sputtering process, and having a thickness of approximately 20 nm to 40 nm. The side wall spacer 133 can finely reduce a distance between the second select lines 72 compared with a case where the photolithographic process is utilized. This is effective in enlarging of the insulating film 132, i.e. increasing a wiring width of the second select signal line.

The insulating film 131, conductive film 230 and insulating film 130 are sequentially patterned as shown in FIG. 25 using the insulating film 132 and side wall spacer 133 as etching masks as shown in FIG. 24. In this state, the second select signal line 72 is made using the conductive film 230. The anisotropic etching such as the RIE is applied to the patterning. The insulating film 134 is deposited over the second select signal line 72 as shown in FIG. 25, and is flattened by the CMP process, for instance, so that the insulating film 132 on the second select signal line 72 is exposed.

The through-hole (memory hole) 236 passing through the second select signal 72 and the through-hole (memory hole) 226 communicating with the through-hole 236 and passing through the first select signal line 71 are made in the area for forming the memory cell array 2 as shown in FIG. 26. The through-holes 236 and 226 are made as shown in FIG. 8 by using masks prepared by the photolithographic process, by performing the anisotropic etching such as the RIE, and by using the method for making the through-hole 246 for the select transistor 24 shown in FIG. 8. The through-holes 236 and 226 are cylindrical, and have an inner diameter of 20 nm to 150 nm. A gate insulator film 232 is formed in a side surface of the second select signal line 72 (the control electrode 231 of the second select transistor 23) exposed in the through-hole 236. Further, a gate insulator film 222 is formed on a side surface of the first select signal 71 (the control electrode 221 of the first select transistor 22) exposed in the through-hole 226. The gate insulator films 232 and 222 are silicon oxide films which are prepared by the LPCVD, for instance, and are approximately 5 nm to 20 nm thick. In this embodiment, the silicon oxide films extend all over the substrate 100.

Figure 10:
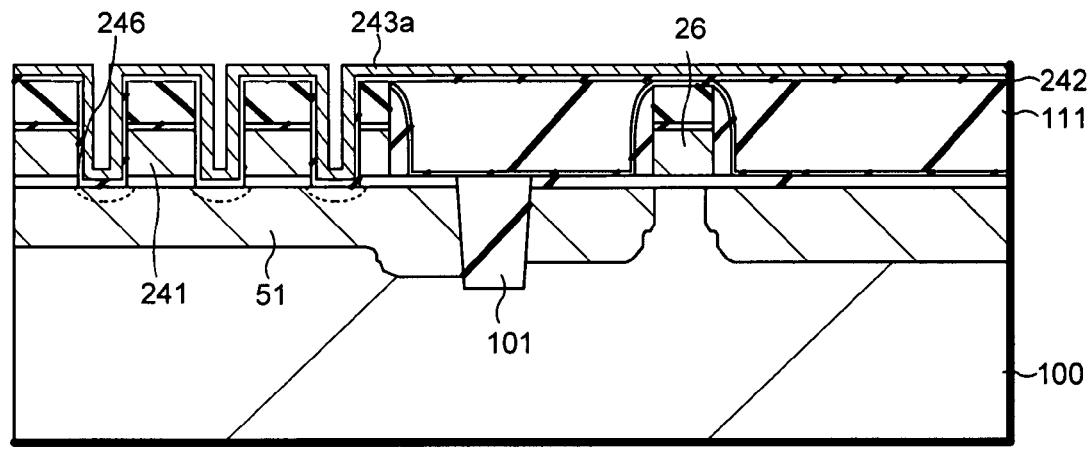
FIG. 10 is a cross section showing how the nonvolatile semiconductor memory is fabricated in a fourth fabricating process.

As in the processes shown in FIG. 10 to FIG. 12, a side wall spacer 233a is made on a side surface of the control electrode 231 in the through-hole 236 via the gate insulator film 232. Further, a side wall spacer 223a is made on a side surface of the control electrode 221 in the through-hole 226 via the gate insulator film 222. Refer to FIG. 26. The side wall spacers 233a and 223a are made of the same conductive layer, serve as etching masks for selectively removing the gate insulator film 222 at the bottom of the through-hole 226, and are used to make the channel making region 223 of the first select transistor 22 and the channel making region 233 of the second select transistor 23. The side wall spacers 233a and 223a are preferably amorphous silicon films which are prepared by the CVD process and are approximately 10 nm to 20 nm thick. The gate insulator film 222 exposed at the bottom of the through-hole 226 is removed using the side wall spacers 233a and 223a as etching masks as shown in FIG. 26, so that a drain 2145 of a memory cell 214 is exposed in the through-hole 226.

Thereafter, a second conductive material 223b is deposited, is embedded in the through-hole 226, and is connected to a drain 2145 of the memory cell 214 at the bottom of the through-hole 226. Further, a second conductive material 233b is deposited, is embedded in the through-hole 236, and is connected to the second conductive material 223b. The second conductive materials 223b and 233b are flush with each other. The channel forming region 223 of the first select transistor 22 is made of the conductive material 223b and the existing side wall spacer (first conductive material) 223a. The channel forming region 233 of the second select transistor 23 is made of the conductive material 233b and the existing side wall spacer (first conductive material) 233a. The second conductive materials 223b and 233b are preferably silicon amorphous films which are prepared by the CVD process, and are thick enough to fill the through-holes 226 and 236. Especially, the second conductive material 233b has its surface polished by the CMP process, and is flush with the insulating film 132.

Further, n-type impurities are doped into the second conductive material 223b (and the side wall spacer 223a) and the second conductive material 233b (and the side wall spacer 233a). In response to the doping of the n-type impurities, the channel forming region 223, main electrode region 224 (e.g. source region) and main electrode region 225 (e.g. drain region) are formed on the area where the first select signal line 71 is present. Further, the channel forming region 233, main electrode region 234 (e.g. source region), and main electrode region 235 (e.g. drain region) are formed on the area where the second select signal line 72 is present. The n-type impurities are P (phosphorus) and As (arsenic). A dose of P is approximately $3 \times 10^{11}$ atoms/cm$^2$ to $7 \times 10^{11}$ atoms/cm$^2$. The P is doped in three energy steps of 210 keV to 230 keV, 240 keV to 260 keV, and 270 keV to 290 keV. In other words, the channel forming regions 223 and 233 have uniform density of the n-type impurities in a direction vertical to the substrate 100. A dose of As is approximately $4\times10^{15}$ atoms/cm$^2$ to $6\times10^{15}$ atoms/cm$^2$. As is doped at energy of 30 keV to 50 keV, and is mainly used to make the main electrode region 235 of the second select transistor 23. The n-type impurities are activated by the RTA (rapid thermal annealing), which is performed at 950 degrees Celsius to 970 degrees Celsius for 8 seconds to 12 seconds. At the end of the foregoing series of fabrication steps, the first and second select transistor 22 and 23 are completed as shown in FIG. 26.

Figure 27:
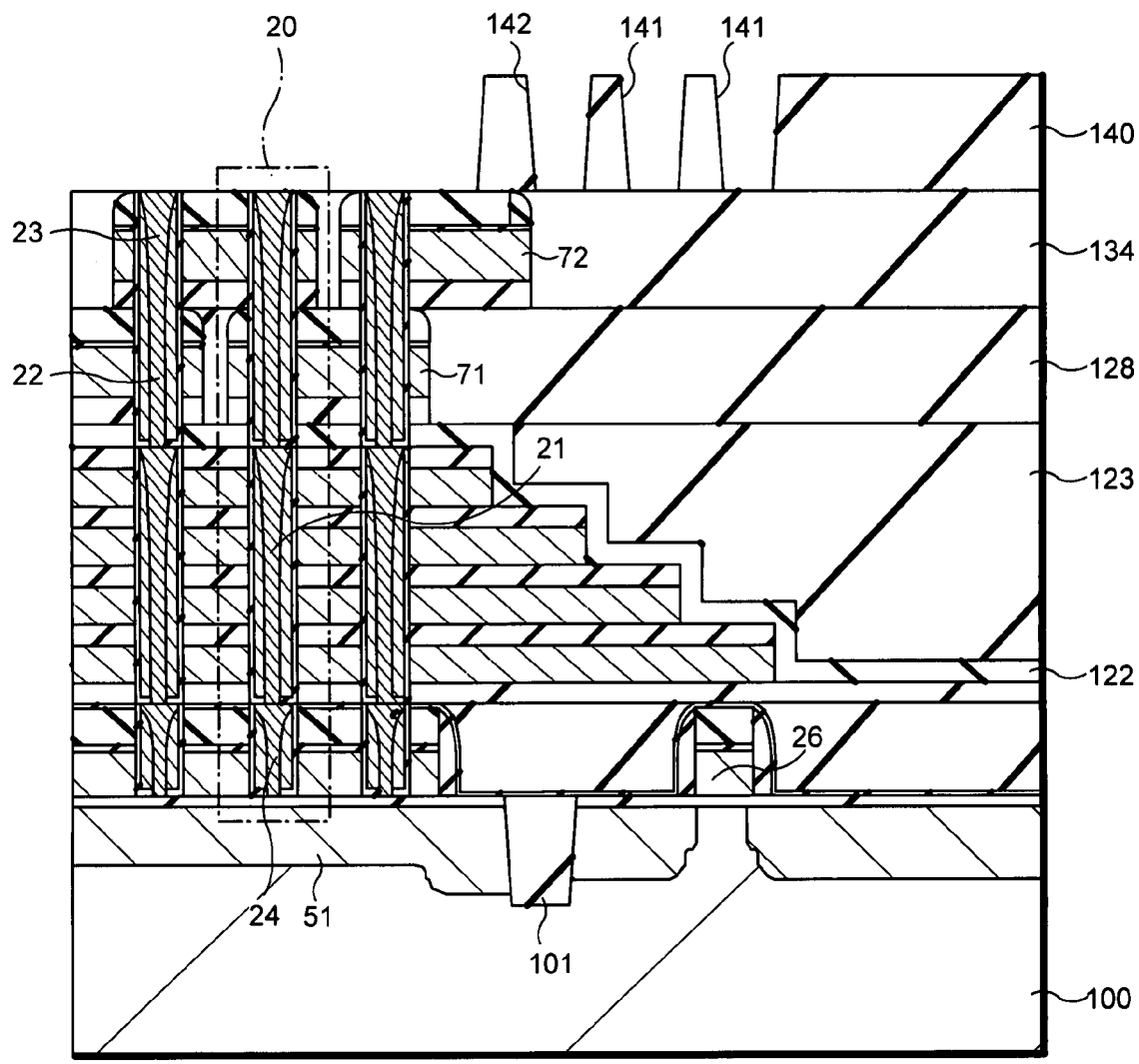
FIG. 27 is a cross section showing how the nonvolatile semiconductor memory is fabricated in a twenty-first fabricating process.

The inter-layer dielectric 140 is formed on the substrate 100, the forming region of the memory cell array 2, and the forming region of the peripheral circuit as shown in FIG. 27. The inter-layer dielectric 140 is preferably a silicon oxide film. A trench 142 is made in order to embed the data line 51 in the inter-layer dielectric 140 on the memory cell array 2, as shown in FIG. 27. Further, a trench 141 is made at the area for the peripheral circuit in order to embed the wiring for connecting the word line 30 and the word line driver 3 (shown in FIG. 6) to the inter-layer dielectric 140. The trenches 141 and 142 are made by the anisotropic etching such as the RIE using a mask prepared by the photolithographic process.

Figure 28:
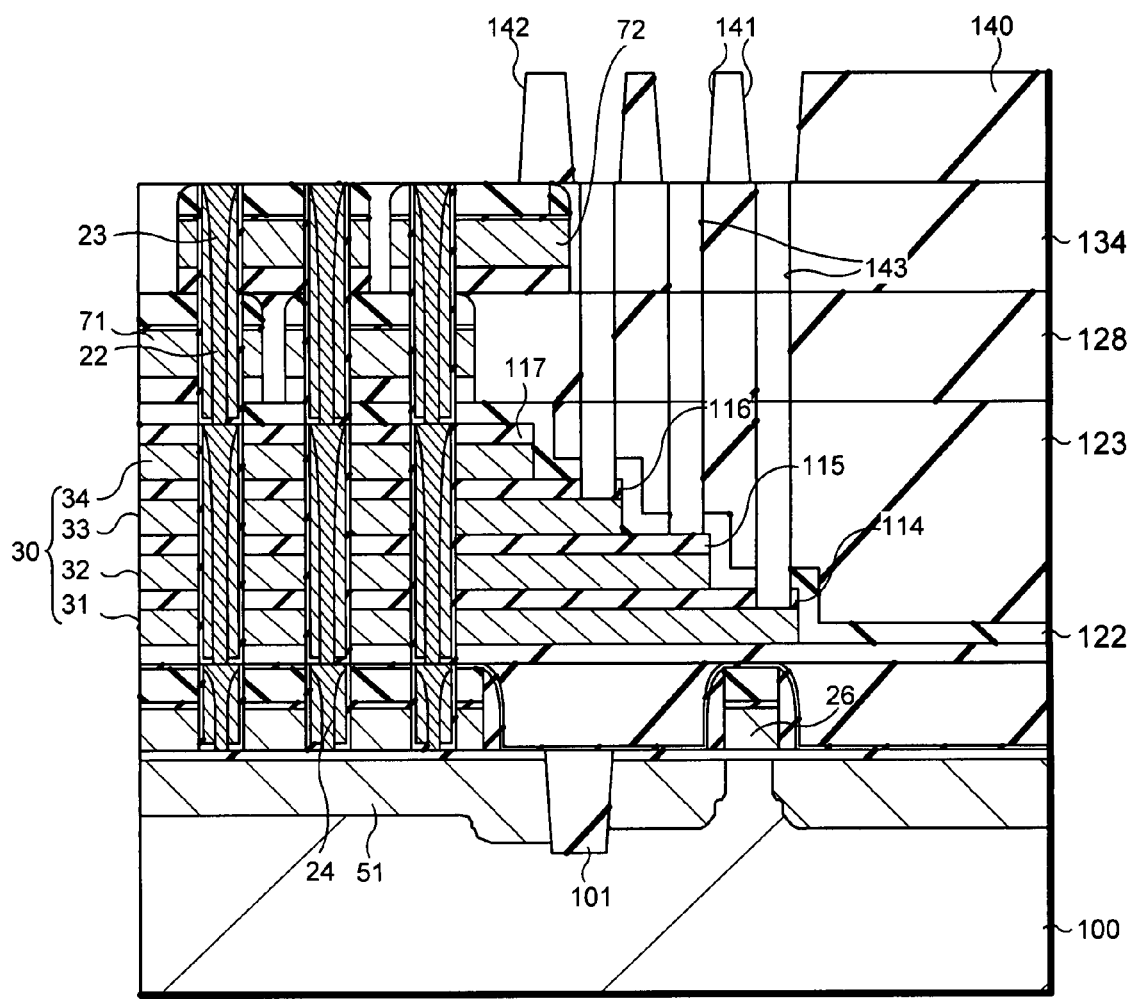
FIG. 28 is a cross section showing how the nonvolatile semiconductor memory is fabricated in a twenty-second fabricating process.

Referring to FIG. 28, the contact holes 143 are made in the trench 141 in the inter-layer dielectric 140 at the area where the peripheral circuit is present (or at the area where the memory cell array is present). A first contact hole 143 extends to the surface of the word line 31 via the insulating films 134, 128, 123, 122 and 114. A second contact hole 143 extends to the surface of the word line 32 via the insulating films 134, 128, 123, 122 and 115. A third contact hole 143 extends to the surface of the word line 33 via the insulating films 134, 128, 123, 122 and 116. A fourth contact hole 143 (not shown) extends to the surface of the word line 34 via the insulating films 134, 128, 122, 123 and 117. Further, another contact hole (not shown) is made in order to connect the peripheral circuit to the n-channel type conductive IGFET 26 at the same time when the contact holes 143 are made.

As shown in FIG. 1, the data line 50 is embedded in the trench 142 in the inter-layer dielectric 140 at the area for forming the memory cell array 2. The wiring 56 is embedded in the trench 141 and is connected to the word line 30 via the contact hole 143 in the inter-layer dielectric 140 at the peripheral circuit forming area. The data line 50 and wiring 56 are made of the same conductive material, are flush with each other, and are damascened in the trenches 142 and 141. The data line 50 and wiring 56 are preferably made of barrier metal films, copper films laminated on the barrier metal films, or composite films of copper alloy films. The NAND type flash memory 1 (shown in FIG. 1) has the one-layer wiring structure including the data line 50 and wiring 56. Alternatively, two- or more-layer wiring structure may be adopted.

[Selection of Memory Cell Unit]

The following describe a method of selecting the memory cell unit 20 of the memory cell array 2 in the NAND type flash memory 1 (shown in FIG. 5). It is assumed here that the memory cell unit 20(3) is selected.

First of all, an address signal is fed to the first decoder unit 85 of the select gate decoder 8 in order to select the memory cell units 20(2) and 20(3). At the same time, the foregoing address signal is also fed to the second decoder unit 86 in order to select the memory cell units 20(3) and 20(4). In response to the address signal, the first decoder unit 85 activates the first driver unit 75 of the select gate driver 7, which selects the first select signal line 71. At the same instant, the second decoder unit 86 activates the second driver 76, which selects the second select signal line 72. When the first select signal line 71 is selected, the first (or third) select transistor 22 of the memory cell unit 20(3) is selected and becomes conductive. Further, when the second select signal line 72 is selected, the second (or fourth) select transistor 23 of the memory cell unit 20(3) is selected and becomes conductive. In short, the first and second select transistors 22 and 23 are selected in the memory cell unit 20(3), so that the memory string 21 and the data line 50 are electrically connected. In this state, the memory cell unit 20(3) is selected. In the selected memory cell unit 20(3), current representing information can flow via the data line 50. Therefore, if any one of memory cells 211 to 214 in the memory string 21 is selected, e.g. if the memory cell 211 is selected, data can be read out from the memory cell 211.

The first select transistor (or the third select transistor) 22 of the memory cell unit 20(3) and the first select transistor (or the first select transistor) 22 of the memory cell unit 20(2) are connected to the same first select signal line 71, so that the first select transistor 22 of the memory cell unit 20(2) is selected and becomes conductive. In this state, the second select transistor (or second select transistor) 23 is not selected and is not conductive, so that the memory cell unit 20(2) is not selected. Further, the second select transistor (the fourth select transistor) 23 of the memory cell unit 20(3) and the second select transistor (the sixth select transistor) 23 of the memory cell unit 20(4) are connected to the same second select signal line 72. The second select transistor 23 of the memory cell unit 20(4) is selected and becomes conductive. Since the first select transistor (or the fifth select transistor) 22 of the memory cell unit 20(4) is not selected and is not conductive, the memory cell unit 20(4) will not be selected.

In the NAND type flash memory 1, the first and second select signal lines 71 and 72 are provided across a plurality of memory cell units 20 extending along the data line 50. Further, the number of the first and second select transistors 22 and 23 correspond to the number of memory cell units 20 across which the first and second select signal lines 71 and 72 are provided. The first and second select transistors 22 and 23 are incorporated in series in the memory cell unit 20, so that the first and second select signal lines 71 and 72 are widened. This enables electrical resistance of the first and second select signal lines 71 and 72 to be reduced, which is effective in accelerating data reading. In this first embodiment, the first and second select signal lines 71 and 72 are placed across two adjacent memory cell units 20 extending along the data line 50. Alternatively, select signal lines can be placed across three or more memory cell units 20. In such a case, the signal lines are placed in three or more layers.

Second Embodiment

In a second embodiment, the present invention is applied to the data line 50 of the NAND type flash memory 1. Further, in the NAND type flash memory 1 relating to a third embodiment which is stated below as well as a second embodiment, because the same construction components as the construction components of the NAND type flash memory relating to the previously stated first embodiment have the same symbols, their explanation is omitted.

[Overall System Configuration of NAND Type Flash Memory]

Figure 29:
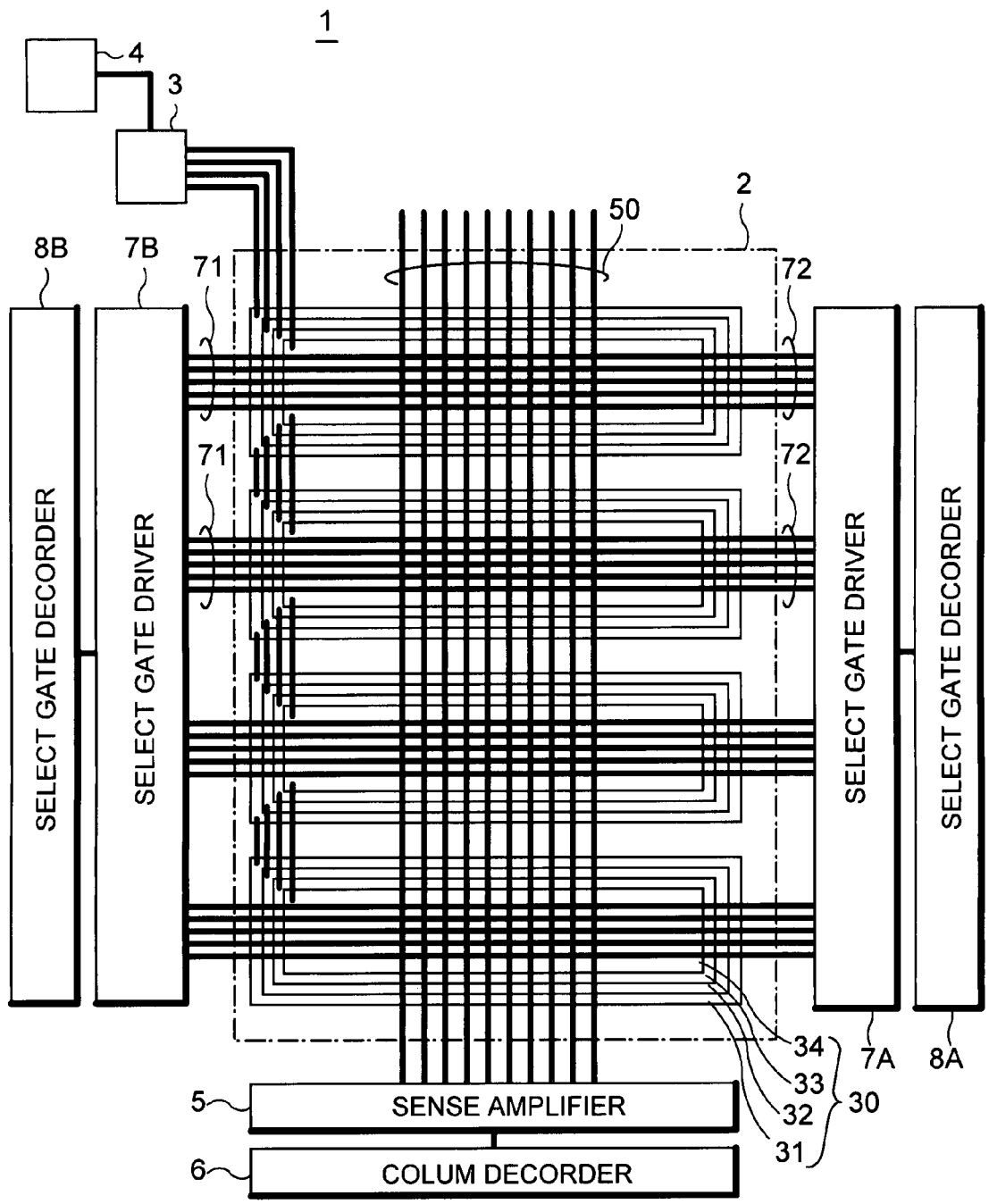
FIG. 29 shows an overall configuration of a system of the nonvolatile semiconductor memory according to a second embodiment of the invention.

Referring to FIG. 29, a NAND type flash memory 1 includes a memory cell array 2, a select gate driver 7, a select gate decoder 8, a word line driver 3, a word line decoder 4, a sense amplifier 5, and a column decoder 6.

The select gate driver 7 includes a first select gate driver unit 7A and a second select gate driver unit 7B. The first select gate driver unit 7A is placed along a right side (first side) of the memory cell array 2 while the second select gate driver unit 7B is placed along a left side (second side) of the memory cell array 2. The select gate decoder 8 includes first and second select gate decoder units 8A and 8B. The first select gate decoder unit 8A is placed at the right side of the memory cell array 2 via the select gate driver unit 7A while the second select gate decoder unit 8B is placed at the left side of the memory cell array 2 via the select gate driver unit 7B. As shown in FIG. 29, the first select gate driver unit 7A extends from side to side in the memory cell array 2, and activates (selects or non-selects) second select signal lines (upper select signal lines) which are equally and longitudinally spaced. The second select gate driver unit 7B extends from side to side in the memory cell array 2, and activates (selects or non-selects) first select signal lines (lower select signal lines) which are equally spaced. The first select gate decoder unit 8A controls the operation of the first select gate driver unit 7A while the second select gate decoder unit 8B controls the operation of the second select gate driver unit 7B. In the second embodiment, the second select signal lines 72 overlap on the first select signal lines 71. The second select gate driver 7B is placed at the left side of the memory cell array 2 in order to activate the first select signal lines 71 while first select gate driver 7A is placed at the right side of the memory cell array 2 in order to active the second select signal lines 72.

The word line driver 3 and the word line decoder 4 are placed along an upper side (third side) of the memory cell array 2. The upper side is present between the right and left sides. The word line driver 3 activates (selects or non-selects) the word line 30. The word line decoder 4 controls the operation of the word line driver 3.

The sense amplifier 5 and the column decoder 6 are placed at a lower side (fourth side) between the right and left sides of the memory cell array 2. The sense amplifier 5 is connected to the data lines 50, reads data from memory cells in the memory cell array 2 via the data lines 50, and amplifies the read data. The column decoder controls the operation of the sense amplifier 5.

[Circuit Configuration of Memory Cell Unit of NAND Type Flash Memory]

Figure 30:
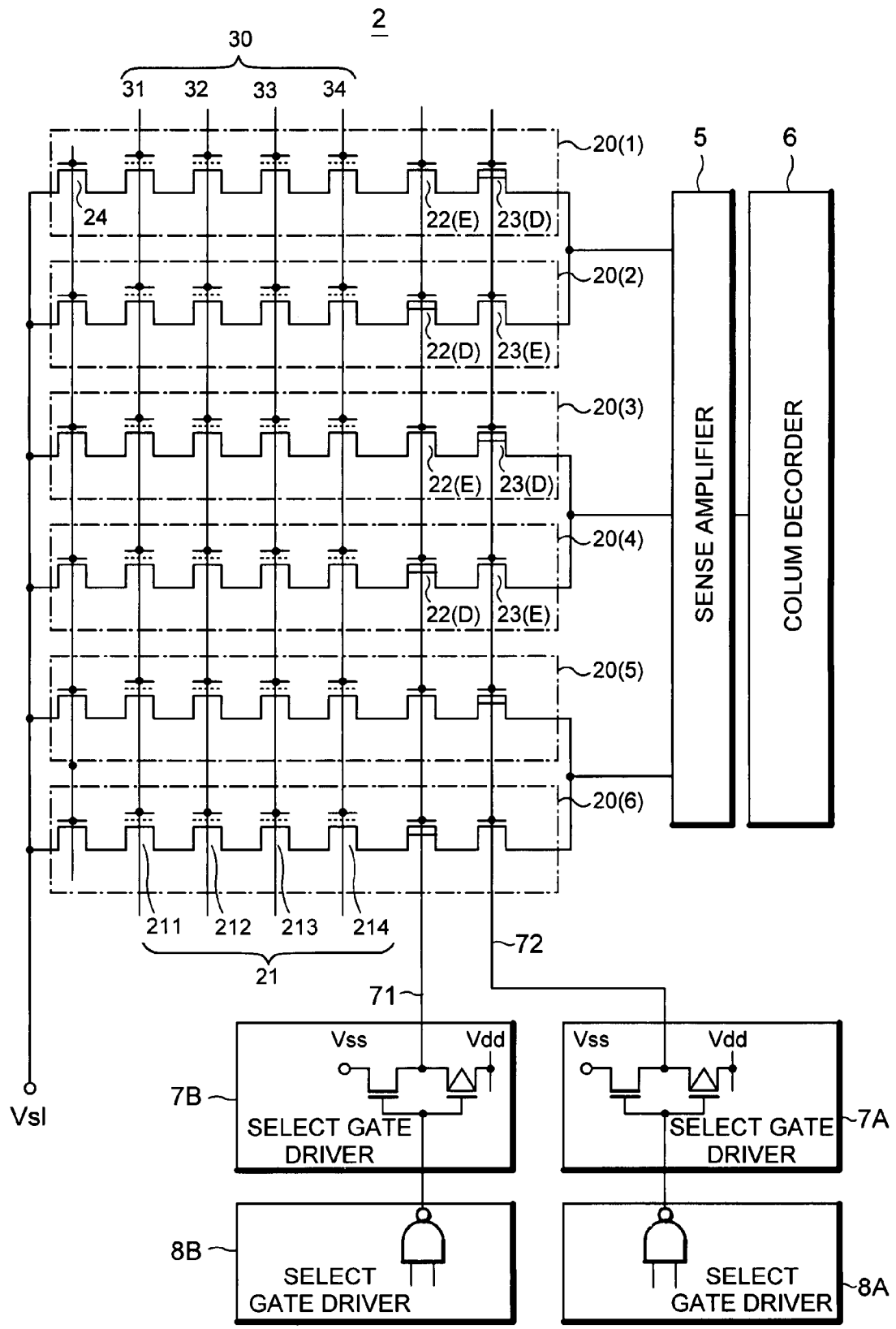
FIG. 30 is a circuit diagram of an essential part of the system of the nonvolatile semiconductor memory according to the second embodiment of the invention.

In the memory cell unit 2, memory cell units 20 are arranged in the shape of a matrix as shown in FIG. 30. Similarly to the memory cell units 20 in the first embodiment, each memory cell unit 20 includes a memory string (memory cell column) 21 having memory cells 211, 212, 213 and 214; a select transistor 24 electrically connected in series to a source of the memory cell 211 at one end of the memory string 21; a first (or third) select transistor 22 electrically connected in series to a drain of the memory cell 214 at the other end of the memory string 21; and a second (or fourth) select transistor 23 electrically connected in series to a drain of the first select transistor 22.

Each of the memory cells 211 to 214 of the memory string 21 has the same structure, and is constituted by a transistor having a charge accumulating region, or an n-channel conductive insulating gate type IGFET. The drain of the memory cell 211 is electrically connected to the source of the memory cell 212; the drain of the memory cell 212 is electrically connected to the source of the memory cell 213; and the drain of the memory cell 213 is electrically connected to the source of the memory cell 214. A control electrode of the memory cell 211 is electrically connected to the word line 31; a control electrode of the memory cell 212 is electrically connected to the word line 32; a control electrode of the memory cell 213 is electrically connected to the word line 33; and a control electrode of the memory cell 214 is electrically connected to the word line 34. In this second embodiment, the memory string 21 is electrically connected in series to the four memory cells 211 to 214. Alternatively, the memory string 21 may be electrically connected in series to 8, 16, 36, . . . memory cells so long as they can accomplish the byte organization. The device configuration of the memory cells 211 to 214 will be described in detail later.

A drain of the select transistor 24 is electrically connected to the source of the memory cell 211 while a source of the select transistor 24 is electrically connected to the source lines 51 as described above. The select transistor 24 is an n-channel conductive IGFET. The source of the first select transistor 22 is electrically connected to the drain of the memory cell 214. The drain of the first select transistor 22 is electrically connected to the source of the second select transistor 23. The drain of the second select transistor 23 is electrically connected to the data lines 50. The first and second select transistors 22 and 23 are n-channel conductive IGFETs. In the second embodiment, the first select transistor 22 includes a first select transistor element 22(E) having an enhancement type threshold voltage and a second select transistor element 22(D) having a depression type threshold voltage. The second select transistor 23 includes a first select transistor element 23(E) having an enhancement type threshold voltage and a second select transistor element 23(D) having a depression type threshold voltage. One memory cell unit 20 is constituted by the first select transistor element 22(E) and the second select transistor element 23(D). Further, another memory cell unit 20 is constituted by the first (or third) select transistor element 22(D) and the second (or fourth) select transistor element 23(E).

In the second embodiment, the memory cell units 20(1) and 20(2), for instance, are electrically connected in parallel to the same data line 50, are adjacent to each other, and extend along the data line 50. The memory cell unit 20(1) is constituted by the first select transistor element 22(E) and the second select transistor element 23(D). The memory cell unit 20(2) is constituted by the first select transistor element 22(D) and the second select transistor element 23(E). Structure for connecting the two memory cell units 20 to one data line 50 is duplicated as a basic pattern in the memory cell array 2. In short, another data line 50 in a next tier is electrically connected in parallel to the memory cell unit 20(3) including the first and select transistors 22(D) and 23(E), and the memory cell unit 20(4) including the first and second select transistor elements 22(D) and 23(E).

Control electrodes of the first select transistors 22(E) and 22(D) of the memory cell units 20(1), 20(2), 20(3), 20(4), . . . are connected to the first select signal line 71. Control electrodes of the second select transistor elements 22 (D) and 22(E) of the memory cell units 20(1), 20(2), 20(3), 20(4), and so on are connected to the first select signal line 72.

In other words, one data line 50 extends across the memory cell unit 20(1) and the memory cell unit 20(2) which are adjacent to each other and are present along the data line 50. Further, the first select transistor element 22(E) and the second select transistor element 23(D) having different threshold voltages are arranged between the memory string 21 and the data line 50 in the memory cell unit 20(1). The first select transistor element 22(D) and the second select transistor element 23(E) having different threshold voltages are arranged between the memory string 21 and the data line 50 in the memory cell unit 20(2).

In the second embodiment, one data line 50 is connected to the two memory cell units 20(1) and 20(2). Alternatively, one data line 50 may be connected to three or more memory cell units 20. In such a case, three select transistors which are electrically connected in series are arranged between the memory string 21 and data line 50 of one memory cell unit 20.

[Circuit Configuration of Select Gate Driver and Select Gate Decoder]

Referring to FIG. 30, the select gate driver 7 includes a first driver unit 7B connected to the first select signal line 71, and a second driver unit 7B connected to the first select signal line 72. The first and second driver units 7B and 7A are p-channel conductive IGFETs and complementary IGFETs having n-channel conductive IGFETs. A drain of the p-channel conductive IGFET and a drain of the n-channel conductive IGFET are connected to the first select signal line 71 or the second select signal line 72. A source of the p-channel conductive IGFET is connected to a power source terminal Vdd while a source of the n-channel conductive IGFET is connected to a control terminal Vss. A control electrode (gate electrode) of the p-channel conductive IGFET constituting the first driver unit 7B and a control electrode of the n-channel conductive IGFET are connected to the decoder unit 8B of the select gate decoder 8. A control electrode of the p-channel conductive IGFET constituting the second driver unit 7A and a control electrode of the n-channel conductive IGFET are connected to the decoder unit 8A of the select gate decoder 8.

[General Configuration of Memory Cell Units, Memory Cells and Select Transistors]

Figure 31:
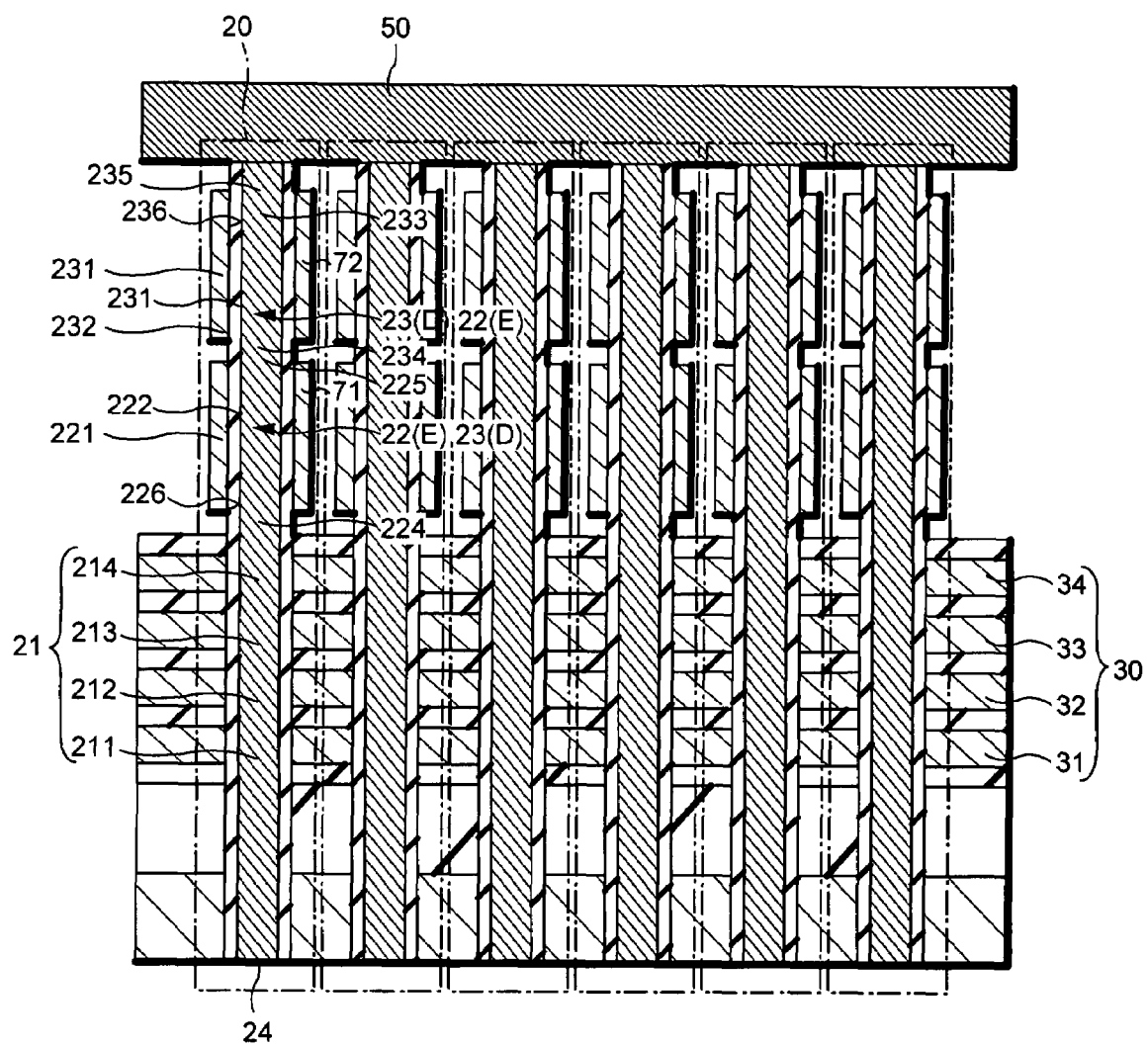
FIG. 31 is a schematic cross section of the essential part of the nonvolatile semiconductor memory (taken along line F31-F31 in FIG. 33)
Figure 32:
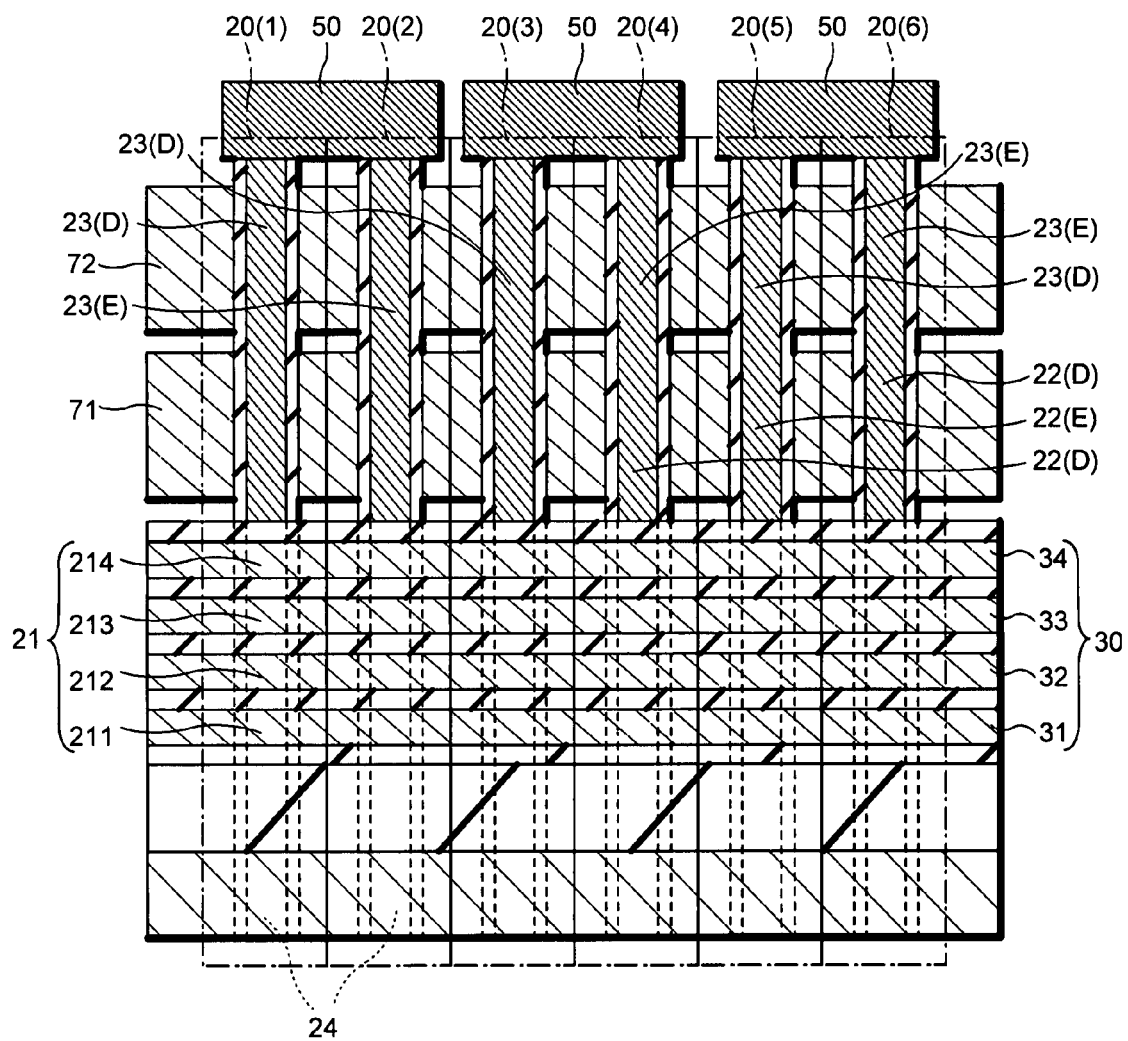
FIG. 32 is a schematic cross section of the essential part of the nonvolatile semiconductor memory (taken along line F32-F32 in FIG. 33)
Figure 33:
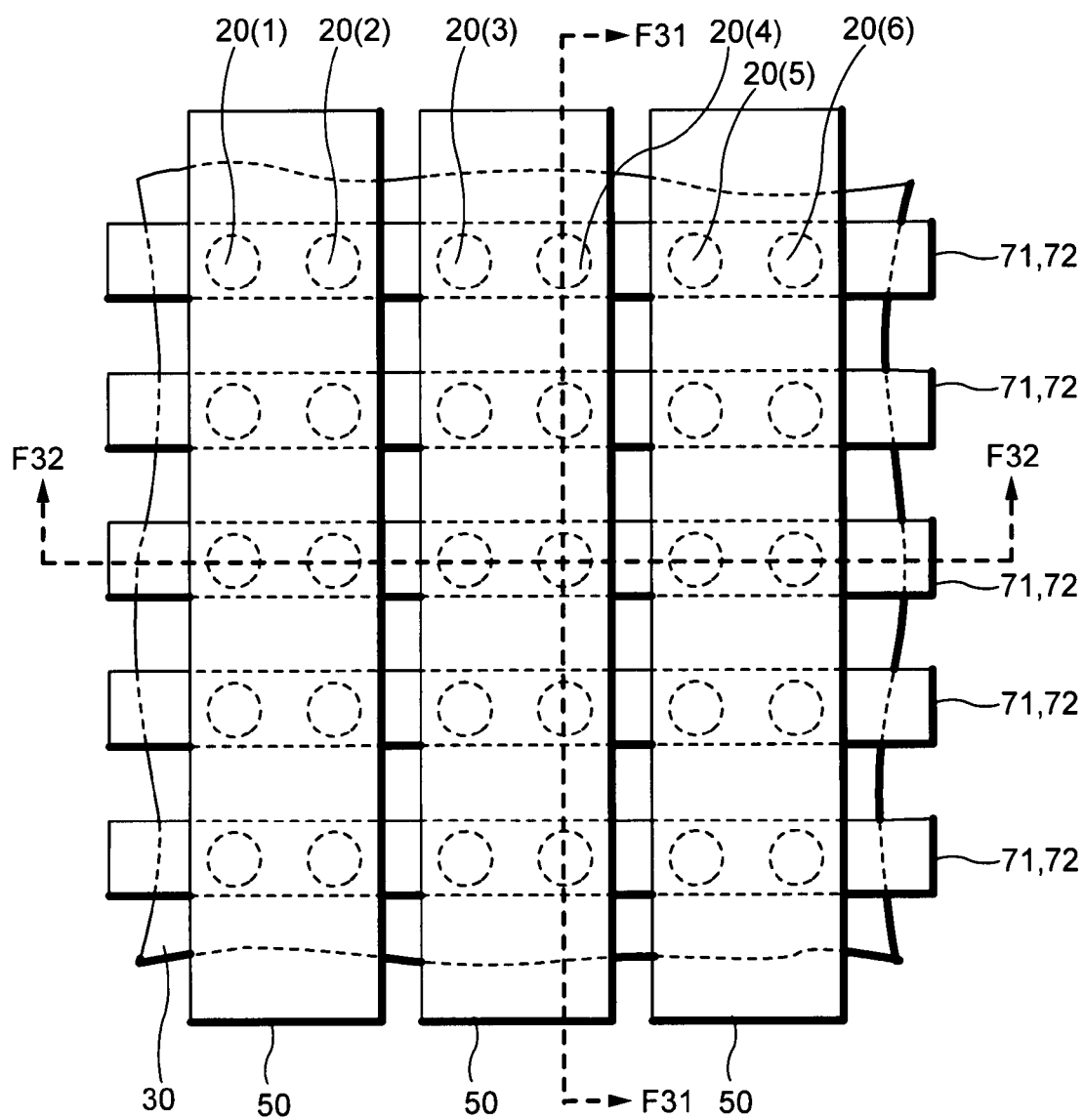
FIG. 33 is a schematic top plan view of the essential part of the nonvolatile semiconductor memory shown in FIG. 31 and FIG. 32)

The NAND type flash memory 1 of the second embodiment is configured as shown in FIG. 31 to FIG. 33. In the NAND type flash memory 1, the following components are similar to those of the NAND type flash memory 1 of the first embodiment: the select transistor 24 of the memory cell unit 2, and memory string 21 (memory cells 211 to 214) which are shown in FIG. 1 to FIG. 4, and FIG. 18. These components are not described here.

The first select transistor 22 of the memory cell unit 20 is an n-channel conductive IGFET, and includes a control electrode (gate electrode) 221 placed on the memory cell 214; a gate insulator film 222 placed on an inner wall of a through-hole (memory hole) 226 which longitudinally extends through the control electrode 221; a channel forming region 223 formed in the inner wall of the memory hole 226 (on an outer wall of the control electrode 221) via the gate insulator film 222; a main electrode region (e.g. a source region) 224 electrically connected to one end of the channel forming region 223 and a drain 2145 of the memory cell 214; and a main electrode region (e.g. a drain region) 225 electrically connected to the other end of the channel forming region 223. The outer wall of the channel forming region 223 is completely surrounded by the control electrode 221. The channel forming region 223 is cylindrical (triangular or polygonal), and longitudinally extends on the substrate 100. In other words, the channel of the first select transistor 22 stands on the substrate 100, and is adjusted to either the enhancement or depression threshold voltage by the n- or p-type impurities doped into the channel forming region 223.

The second select transistor 23 of the memory cell unit 20 is an n-channel conductive IGFET similarly to the first select transistor 22, and includes a control electrode (gate electrode) 231 placed on the first select transistor 22; an gate insulator film 232 placed on an inner wall of a through-hole 236 which longitudinally extends through the control electrode 231; a channel forming region 223 formed in the inner wall of the through-hole 236 (on the outer wall of the control electrode 231) via the gate insulator film 232; a main electrode region (e.g. a source region) 234 electrically connected to one end of the channel forming region 233; and a main electrode region (e.g. a drain region) 235 electrically connected to the other end of the channel forming region 233. The outer wall of the channel forming region 233 is completely surrounded by the control electrode 231. The channel forming region 233 is cylindrical (triangular or polygonal), and longitudinally extends on the substrate 100. In other words, the channel of the second select transistor 23 stands on the substrate 100, and is adjusted to either the enhancement or depression threshold voltage by the n- or p-type impurities doped into the channel forming region 233. The main electrode region 235 of the second select transistor 23 is connected to one of the data lines 50.

The foregoing data line 50 extends across two memory cell units 20(1) and 20(2) which are adjacent with each other along the data line 50, and is electrically in parallel connected to the memory cell units 20(1) and 20(2). Another data line 50 extends across two memory cell units 20(3) and 20(4) which are adjacent with each other along the data line 50, and is electrically in parallel connected to the memory cell units 20(3) and 20(4). Still another data line 50 extends across two memory cell units 20(5) and 20(6) which are adjacent with each other along the data line 50, and is electrically in parallel connected to the memory cell units 20(5) and 20(6). In other words, the data lines 50 are integral to two adjacent memory cell units 20 without any space, which triples widths of the data line 50, and reduces a resistance value of the data lines 50 to approximately one third.

[Selection of Memory Cell Unit]

In the NAND type flash memory 1, the memory cell units 20 of the memory cell array 2 are selected as described hereinafter. It is assumed here that the memory cell unit 20(1) will be selected.

First of all, the address signal is inputted into the first and second select gate decoder units 8A and 8B in order to select the memory cell units 20(1), 20(2), 20(3), 20(4), and so on. The first select gate driver unit 7A is activated in response to the address signal to the first select gate decoder unit 8A. Following the activation of the first select gate driver unit 7A, the second select signal line 72 is set to a low level "L". Further, the second select gate driver unit 7B is activated in response to the address signal to the second select gate decoder unit 8B. Following the activation of the second select gate driver unit 7B, the first select signal line 71 is set to a high level "H".

When the first select signal line 71 is selected, the first select transistor element 22(E) having the enhancement threshold voltage for the memory cell units 20(1), 20(3), 20(5) and so on is selected and becomes conductive. The first select transistor element 22(D) having the depression threshold voltage for the memory cell units 20(2), 20(4), 20(6) and so on is not selected and remains non-conductive. On the other hand, when the second select signal line 72 is selected, the second select transistor element 23(D) having the depression threshold voltage for the memory cell units 20(1), 20(3), 20(5) and so on is selected, and becomes conductive. The second select transistor element 23(E) having the enhancement threshold voltage for the memory cell units 20(2), 20(4), 20(6) and so on is not selected and remains non-conductive. In short, in response to the selection of the first and second select signal lines 71 and 72, the first and second select transistors 22(E) and 23(D) for the memory cell units 20(1), 20(3), 20(5) and so on become conductive.

When the column decoder 6 selects the data line 50 connected to the memory cell units 20(1) and 20(2), only the memory cell unit 20(1) is selected because the first and second select transistor elements 22(D) and 23(E) of the memory cell unit 20(2) remain non-conductive. In the selected memory cell unit 20(1), current representing information can flow via the data line 50, so that data can be read out from the memory cell 211 as long as one, of the memory cells 211 to 214 in the memory string 21 is selected.

In the NAND flash memory 1 of the second embodiment, each data line 50 can be placed across a plurality of memory cell units 20. Further, the number of the first and second select transistors 22 and 23 correspond to the number of memory cell units 20 across which the data line 50 is provided. It is possible to increase a wiring width of the data line 50 by adjusting the threshold voltage of the first or second select transistor 22 or 23 for selecting one of memory cell units 20 connected to one data line 50. This is effective in reducing electrical resistance of the data line 50, and in accelerating the data reading. In the second embodiment, one data line 50 is provided across the two memory cell units 20 which are adjacent to each other along the data line 50. Alternatively, the data line 50 can be provided across three or more memory cell units 20. In such a case, the select signal lines will be in three or more layers, and three or more select transistors will be electrically connected in series between the memory string 21 of the memory cell units 20 and the data line 50.

The NAND flash memory 1 of the second embodiment is fabricated similarly to the NAND flash memory 1 of the first embodiment.

Third Embodiment

A NAND flash memory 1 of a third embodiment is a combination of the NAND flash memories 1 of the first and second embodiments. The invention is applied to select transistors, and select signal lines and data lines for selecting the select transistors.

[General Configuration of Memory Cell Units, Memory Cells and Select Transistors]

Figure 34:
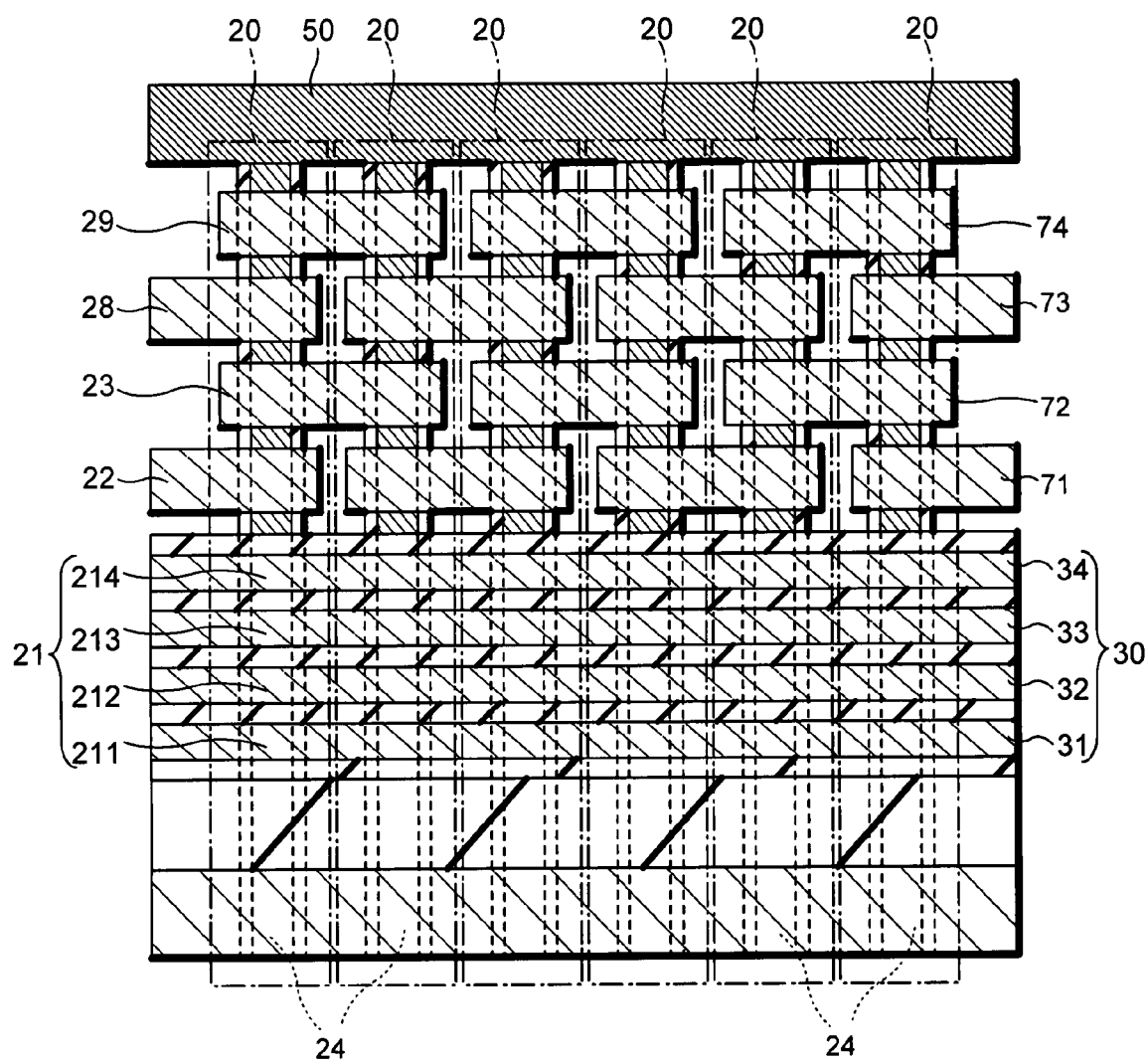
FIG. 34 is a schematic cross section of the essential part of the nonvolatile semiconductor memory (taken along line F34-F34 in FIG. 36)
Figure 35:
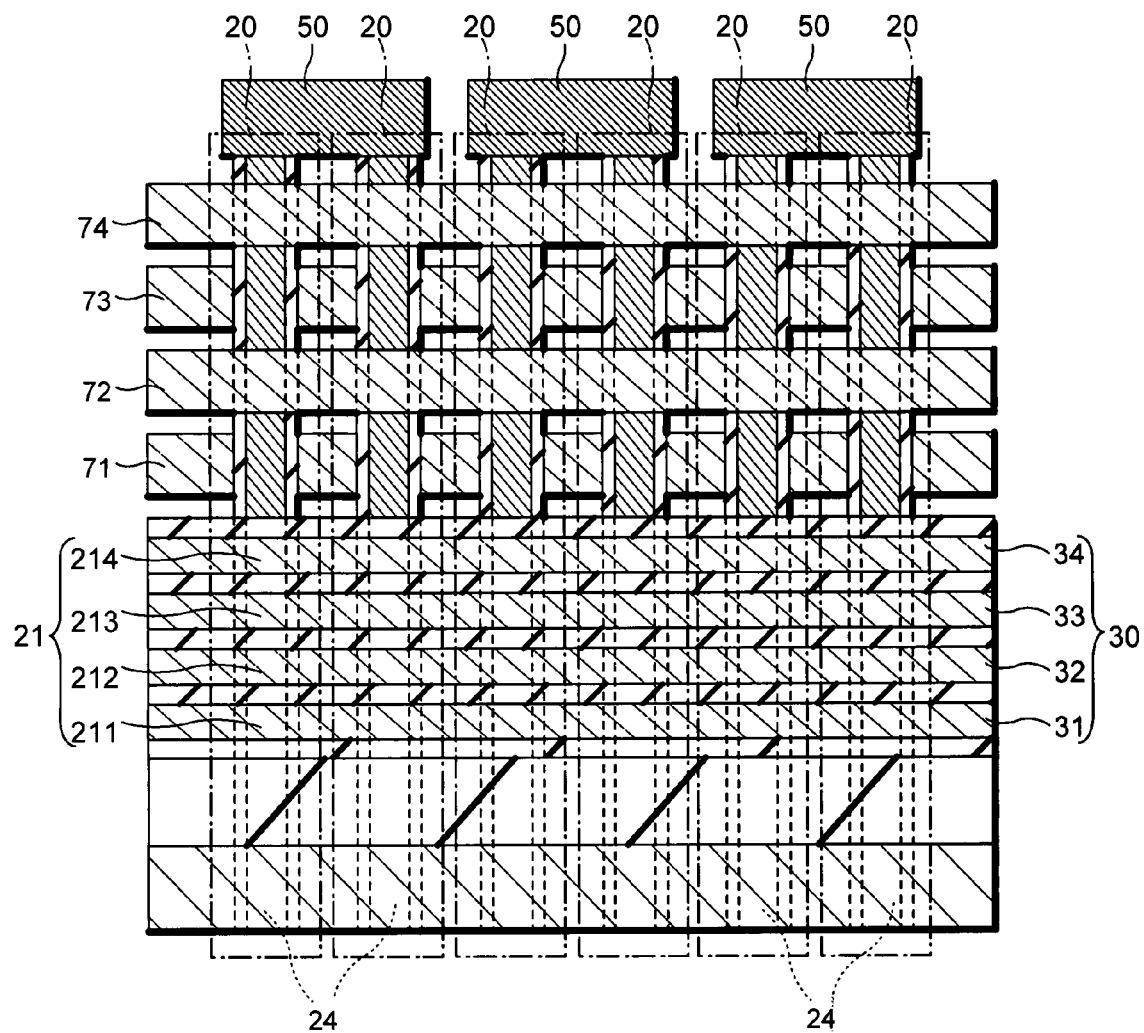
FIG. 35 a schematic cross section of the essential part of the nonvolatile semiconductor memory according to a third embodiment (taken along line F36-F36 in FIG. 36)
Figure 36:
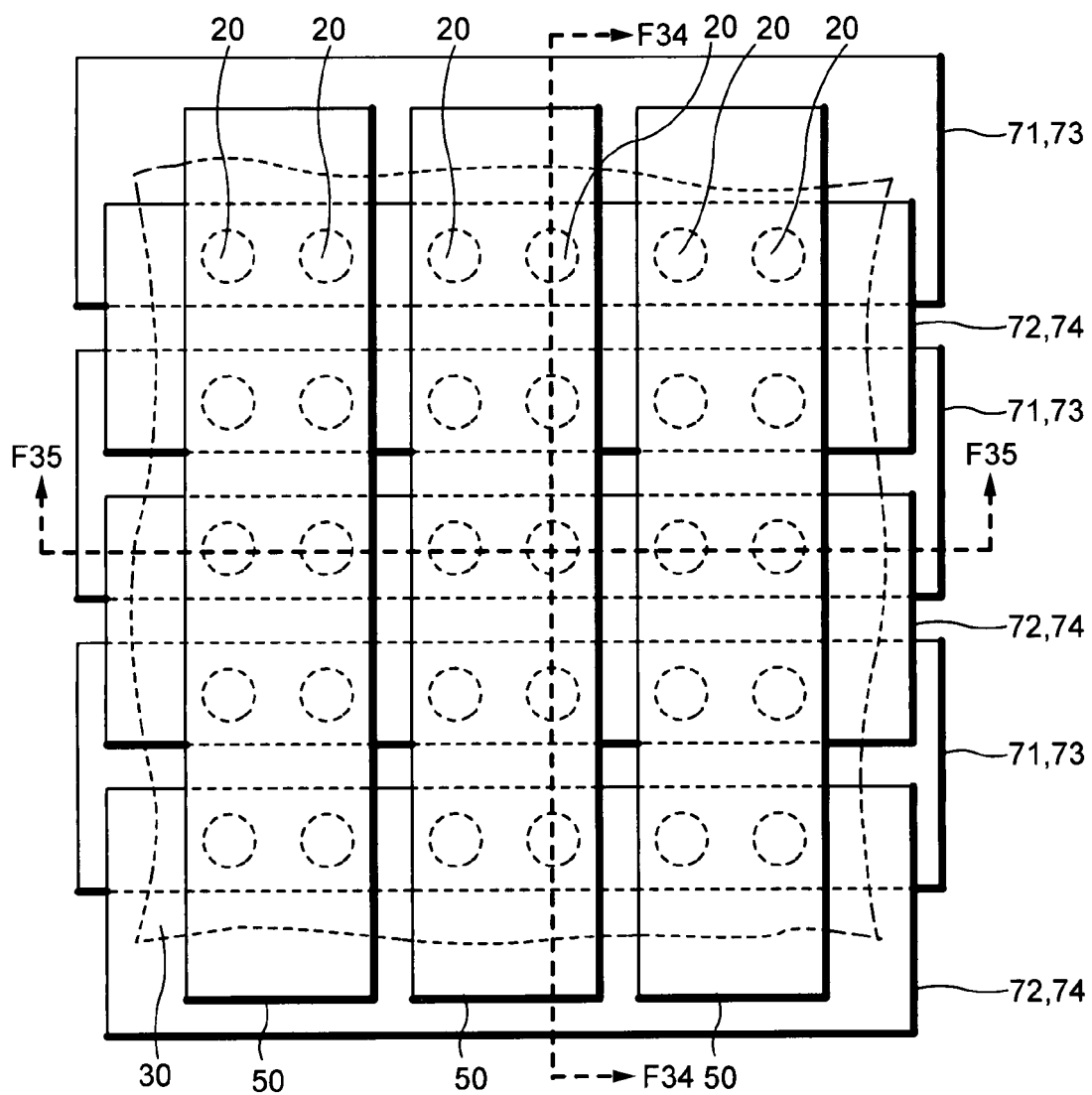
FIG. 36 is a schematic top plan view of the essential part of a nonvolatile semiconductor memory shown in FIG. 34 and FIG. 35).

The NAND flash memory 1 is configured as shown in FIG. 34 to FIG. 36. In the NAND flash memory 1, the second select transistor 24 and the memory string 21 (memory cells 211 to 214) of the memory cell unit 2 are identical to the second select transistor 24 and memory string (memory cells 211 to 214) of the first embodiment shown in FIG. 1 to FIG. 4 and FIG. 18. Therefore, these components are not described here.

In the third embodiment, the first and second select transistors 22 and 23, and the third and fourth select transistor 28 and 29 are placed between the uppermost memory cell 214 of the memory string 21 in the memory cell unit 20 and the data line 50. The foregoing select transistors 22, 23, 28 and 29 are electrically connected in series from the memory cell 214 to the data line 50.

In the first select transistor 22 of the two adjacent memory cell units 20 which extend along the data line 50, the control electrodes (gate electrodes) are electrically interconnected as in the first select transistor 22 of the first embodiment, and are electrically and finally connected to the first select signal line 71. Further, in the first select transistor 22 of the two adjacent memory cell units 20, the control electrodes (gate electrodes) are electrically interconnected as in the first select transistor 22 of the first embodiment, and are electrically and finally connected to the first select signal line 71. In short, a total of four memory cell units 20 which are adjacent to one another along the data line 50 are electrically connected to one data line 50. A total of four first select transistors 22 of the four memory cell units 20 are designed to have the enhancement type threshold voltage. The four memory cell units 20 are arranged in the shape of a matrix as a basic unit. A plurality of basic units are provided in the memory cell array 2.

In the second select transistor 23 of the two adjacent memory cell units 20 which extend along the data line 50, the control electrodes (gate electrodes) are electrically interconnected as in the first select transistor 23 of the first embodiment, and are electrically and finally connected to the second select signal line 72. Further, in the second select transistor 23 of the two adjacent memory cell units 20 which extend along the data line 50, the control electrodes (gate electrodes) are electrically interconnected as in the second select transistor 23 of the first embodiment, and are electrically and finally connected to the first select signal line 71. Each second select signal line 72 is displaced in the extending direction of the data line 50 by a half pitch (corresponding to one memory cell unit 20) from the first select signal line 71. The second select transistors 23 are designed to have the enhancement type threshold voltage.

In the third select transistor 28 of the two adjacent memory cell units 20 which extend along the data line 50, the control electrodes (gate electrodes) are electrically interconnected as in the first select transistor 22 of the first embodiment, and are electrically and finally connected to the third select signal line 73. Further, in the third select transistor 28 of the two adjacent memory cell units 20 which extend along the data line 50, the control electrodes (gate electrodes) are electrically interconnected as in the first select transistor 22 of the second embodiment, and are electrically and finally connected to the third select signal line 73. Each third select signal line 73 is arranged along the data line 50 by a pitch equal to that of the first select signal line 71. The third select transistors 28 are designed to have the enhancement type threshold voltage.

In the fourth select transistor 29 of the two adjacent memory cell units 20 which extend along the data line 50, the control electrodes (gate electrodes) are electrically interconnected as in the second select transistor 23, and are electrically and finally connected to the fourth select signal line 74. Further, in the fourth select transistor 29 of the two adjacent memory cell units 20 which extend along the data line 50, the control electrodes (gate electrodes) are electrically interconnected as in the second select transistor 23 of the second embodiment, and are electrically and finally connected to the fourth select signal line 74. Each fourth select signal line 74 is arranged in the extending direction of the data line 50 by a pitch equal to that of the second select signal line 72. The fourth select transistors 29 are designed to have the enhancement type threshold voltage.

In the NAND type flash memory 1 of the third embodiment, the first, second, third and fourth select signal lines 71, 72, 73 and 74 are arranged across a plurality of memory cell units 20 extending along the data lines 50. Further, the first, second, third and fourth select transistor 22, 23, 28 and 29 are incorporated in the memory cell units 20. This is effective in increasing the wiring widths of the first to fourth select signals 71 to 74, and the wiring widths of the data lines 50. Therefore, the electrical resistance values of the first and second select signal lines 71 and 72, and those of the data lines 50 can be reduced, so that data can be red out at an accelerated speed.

Other Embodiments

While the invention has been described by means of specific embodiments and applications thereof, numerous modifications and variations could be made thereto by those skilled in the art without departing from the scope of the invention set forth in the claims. For instance, in the NAND type flash memory 1 of the third embodiment, the select transistors in the NAND type flash memory 1 of the second embodiment and having the enhancement type threshold voltage may be incorporated between the memory string 21 of the memory cell unit 20 and the data lines 50. Further, the invention is applicable to nonvolatile memories such as EPROM and ROM as well as to the NAND type flash memory 1.

According to the invention, the nonvolatile semiconductor memory can accelerate the data reading, and reduce the resistance values of the select signal lines, and the resistance values of data lines.

What is claimed is:

1. A nonvolatile semiconductor memory comprising:
   a data line;
   a first memory cell unit including not only a first memory string in which a plurality of memory cells with charge accumulating regions are electrically connected in series but also first and second select transistors connected to said data line from one end of said first memory string;
   a second memory cell unit including not only a second memory string structured similarly to said first memory string but also third and fourth select transistors connected to said data line from one end of said second memory string, said second memory cell unit being adjacent to said first memory cell unit;
   a third memory cell unit including not only a third memory string structured similarly to said first memory string but also fifth and sixth select transistors connected to said data line from one end of said third memory string, said third memory cell unit being adjacent to said second memory cell unit;
   a first select signal line electrically connected to a control electrode of said first select transistor of said first memory cell unit and to a control electrode of said third select transistor of said second memory cell unit; and
   a second select signal line electrically connected to a control electrode of said fourth select transistor of said second memory cell unit and to a control electrode of said sixth select transistor of said third memory cell unit.

2. The nonvolatile semiconductor memory according to claim 1, wherein each of said first to third memory strings is constituted by a plurality of said memory cells stacked on a substrate.

3. The nonvolatile semiconductor memory according to claim 2, wherein said first, third and fifth select transistors are stuck on a first layer of said first to third memory strings, and said second, fourth and sixth select transistors are stuck on a second layer on said first layer.

4. The nonvolatile semiconductor memory according to claim 3, wherein the said data lines are placed on said second layers.

5. The nonvolatile semiconductor memory according to claim 4, wherein said first select signal line is placed in the said first layer and has a width extending across said first select transistor and said third select transistor, and said second select signal line is placed in the said second layer and has a width extending across said fourth select transistor and said sixth select transistor.

6. The nonvolatile semiconductor memory according to claim 5, wherein said second select signal line is displaced by a half pitch from a wiring pitch of said second select signal line.

7. The nonvolatile semiconductor memory according to claim 5, wherein said first and second select transistors are insulated gate field effect transistors.

8. The nonvolatile semiconductor memory according to claim 7, wherein each of said first and second select transistors includes said control electrode placed on said memory cells; a gate insulator film placed on an inner wall of a through-hole longitudinally extending through said control electrode; a channel forming region embedded in said inner wall of said through-hole via said gate insulator film; and a pair of main electrode regions placed at opposite ends of said channel forming region.

9. The nonvolatile semiconductor memory according to claim 7, wherein each memory cell of said first to third memory strings includes a control gate electrode, a charge accumulating region placed on an inner wall of said through-hole extending through said control gate electrode, a channel forming region embedded in said inner wall of said through-hole via said charge accumulating region.

10. The nonvolatile semiconductor memory according to claim 8, wherein said first and second select transistors are made of gate electrode materials, and said data lines are made of conductive films having low resistances compared to resistance of said control electrode.

11. The nonvolatile semiconductor memory according to claim 1, further comprising:
    a memory cell array in which said first to third memory cell units are arranged and which has first to fourth sides;
    a select gate driver placed along said first side of said memory cell array, and including a first driver unit activating said first select signal line and a second driver unit activating said second signal line;
    a select gate decoder controlling operations of said select gate driver;
    a word line driver placed along said second side opposite to said first side of said memory cell array, and activating word lines connected to said memory cell arrays of said first to third memory strings;
    a word line decoder controlling operations of said word line driver;
    a column decoder including elements separately placed along said third and fourth sides of said memory cell array, and selecting said data lines, the third side being present between said first and second sides, and the fourth side being opposite to said third side; and
    a sense amplifier including elements separately placed along said third and fourth sides, and connected to said data lines.

12. The nonvolatile semiconductor memory according to claim 5, further comprising:
    a memory cell array in which said first to third memory cell units are arranged and which has first to fourth sides;
    a select gate driver placed along said first side of said memory cell array, and including a first driver unit activating said first select signal line and a second driver unit activating said second signal line;
    a select gate decoder controlling operations of said select gate driver;
    a word line driver placed along said second side opposite to said first side of said memory cell array, and activating said word lines connected to said memory cell arrays of said first to third memory strings;
    a word line decoder controlling operations of said word line driver;
    a column decoder including elements separately placed along said third and fourth sides of said memory cell array, and selecting said data lines, said third side being present between said first and second sides, and said fourth side being opposite to said third side; and a sense amplifier including elements separately placed along said third and fourth sides, and connected to said data lines.

13. The nonvolatile semiconductor memory according to claim 1 is a NAND type flash memory.

14. A nonvolatile semiconductor memory comprising:

a first memory cell unit including a first memory string to which a plurality of memory cells having charge accumulating regions and placed on a surface of a substrate are electrically connected in series; a first enhancement type select transistor electrically connected in series to one end of said first memory string; and a second depression type select transistor electrically connected in series to said first select transistor;

a second memory cell unit including a second memory string structured similarly to said first memory string; a third depression type select transistor electrically connected in series to one end of said second memory string; a fourth enhancement type select transistor electrically connected in series to said third select transistor, said second memory cell unit being adjacent to said first memory cell unit;

a first select signal line connected to said first and third select transistors;

a second select signal line connected to said second and fourth select transistors; and a data line extending across said first and second memory cell units, and electrically connected to said second select transistor of said first memory cell unit and said fourth select transistor of said second memory cell unit.

15. The nonvolatile semiconductor memory according to claim 14, wherein said first and second memory cell units are electrically connected in series to one of said data line, and extend along said data line.

16. The nonvolatile semiconductor memory according to claim 14, wherein each of said first to fourth select transistors includes said control electrode; a gate insulator film placed on an inner wall of a through-hole longitudinally extending through said control electrode; a channel forming region embedded in said inner wall of said through-hole; and a pair of main electrode regions placed at opposite ends of said channel forming region.

17. The nonvolatile semiconductor memory according to claim 14, wherein each of memory cells in said first and second memory cell strings includes a control gate electrode; a charge accumulating region placed on an inner wall of a through-hole longitudinally extending through said control gate electrode; and a channel forming region, embedded in said inner wall of said through-hole via said charge accumulating region, a source and a drain.

18. The nonvolatile semiconductor memory according to claim 14, further comprising:

a memory cell array in which said first and second memory cell units are arranged and which has first to fourth sides;

a first select gate driver placed along said first side of said memory cell array, and activating said first select transistor of said first memory cell unit and said third select transistor of said second memory cell unit;

a first select gate decoder controlling operations of said first gate driver;

a second select gate driver placed along said second side opposite to said first side of said memory cell array, and activating said second select transistor of said first memory cell unit and said fourth select transistor of said second memory cell unit;

a second select gate decoder controlling operations of said second select gate driver;

a word line driver placed along said third side between said first and second sides of said memory cell array, and activating word lines connected to said memory cell arrays of said first and second memory strings;

a word line decoder controlling operations of said word line driver;

a column decoder placed along said fourth side opposite to said third side of said memory cell array, and selecting said data lines; and a sense amplifier placed along said fourth side, and connected to said data line.

19. The nonvolatile semiconductor memory according to claim 14 is a NAND type flash memory.

20. A nonvolatile semiconductor memory comprising:

a data line;

a first memory cell unit including not only a memory string to which a plurality of memory cells having charge accumulating regions are electrically connected in series but also a first enhancement type select transistor, a second depression type select transistor, a third enhancement type select transistor, and a fourth depression type selector, all of which are electrically connected in series to one end of said first memory string;

a second memory cell unit configured similarly to said first memory unit, electrically connected in parallel to said data lines, and being adjacent to said first memory cell unit along said data lines;

a third memory cell unit including a memory string which is structured similarly to said memory string of said first memory cell unit, and includes a fifth depression type select transistor, a sixth enhancement type select transistor, a seventh depression type select transistor, and an eighth enhancement type select transistors, said third memory cell unit being adjacent to said second memory cell unit along said data line and electrically connected in parallel to said data line;

a fourth memory cell unit being adjacent to said third and second memory cell units, extending along said data line, electrically connected to said data line, and structured similarly to said third memory cell unit;

a first select signal line electrically connected not only to control electrodes of said first select transistors of said first and second memory cell units but also to control electrodes of said fifth select transistors of said third and fourth memory cell units;

a second select signal line electrically connected not only to control electrodes of said second select transistors of said first and second memory cell units but also to control electrodes of said sixth select transistors of said third and fourth memory cell units, said second select signal line extending along said data line with a half pitch displaced from said first select signal line;

a third select signal line electrically connected not only to control electrodes of said third select transistors of said first and second memory cell units but also to control electrodes of said seventh select transistors of said third and fourth memory cell units, said second select signal line extending along said data line with a pitch same as that of said first select signal line; and a fourth select signal line electrically connected not only to control electrodes of said fourth select transistors of said first and second memory cell units but also to control electrodes of said eighth select transistors of said third and fourth memory cell units, said fourth select signal line being arranged with a pitch same as that of said second select signal line.

* * * * *

UNITED STATES PATENT AND TRADEMARK OFFICE
CERTIFICATE OF CORRECTION

PATENT NO. : 7,539,056 B2
APPLICATION NO. : 11/896261
DATED : May 26, 2009
INVENTOR(S) : Katsumata et al.

It is certified that error appears in the above-identified patent and that said Letters Patent is hereby corrected as shown below:

Title page Item (57), in the Abstract, line 2, change "plurality" to --plurality of--.

Signed and Sealed this

First Day of September, 2009

David J. Kappos
*Director of the United States Patent and Trademark Office*